(12) United States Patent
Uchiyama et al.

(10) Patent No.: US 9,110,373 B2
(45) Date of Patent: *Aug. 18, 2015

(54) PHENOLIC RESIN AND MATERIAL FOR FORMING UNDERLAYER FILM FOR LITHOGRAPHY

(75) Inventors: Naoya Uchiyama, Kurashiki (JP); Go Higashihara, Kurashiki (JP); Masatoshi Echigo, Hiratsuka (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/123,471

(22) PCT Filed: May 30, 2012

(86) PCT No.: PCT/JP2012/063995
§ 371 (c)(1),
(2), (4) Date: Feb. 3, 2014

(87) PCT Pub. No.: WO2012/165507
PCT Pub. Date: Dec. 6, 2012

(65) Prior Publication Data
US 2014/0186776 A1    Jul. 3, 2014

(30) Foreign Application Priority Data
Jun. 3, 2011   (JP) .................... 2011-125029

(51) Int. Cl.
| G03F 7/11 | (2006.01) |
| G03F 7/075 | (2006.01) |
| C09D 161/06 | (2006.01) |
| G03F 7/09 | (2006.01) |

(52) U.S. Cl.
CPC ............... *G03F 7/11* (2013.01); *C09D 161/06* (2013.01); *G03F 7/0752* (2013.01); *G03F 7/091* (2013.01); *G03F 7/094* (2013.01)

(58) Field of Classification Search
None
See application file for complete search history.

(56) References Cited

U.S. PATENT DOCUMENTS

| 4,954,607 | A | * | 9/1990 | Otani et al. .................... 528/230 |
| 5,094,934 | A | * | 3/1992 | Lazarus et al. ................. 430/309 |
| 5,135,673 | A | * | 8/1992 | Murata et al. ................. 252/62.54 |
| 5,478,871 | A | * | 12/1995 | Takebe et al. .................. 523/443 |
| 6,660,811 | B2 | * | 12/2003 | Ogura et al. .................... 525/523 |
| 7,094,708 | B2 | | 8/2006 | Kato et al. |
| 7,135,539 | B2 | | 11/2006 | Cerf et al. |
| 8,586,289 | B2 | | 11/2013 | Ideno et al. |
| 8,592,134 | B2 | | 11/2013 | Oguro et al. |
| 8,741,553 | B2 | * | 6/2014 | Higashihara et al. .......... 430/323 |
| 2004/0059039 | A1 | | 3/2004 | Cerf et al. |
| 2004/0202959 | A1 | * | 10/2004 | Thackeray et al. ........ 430/270.1 |
| 2005/0255712 | A1 | | 11/2005 | Kato et al. |
| 2008/0227031 | A1 | * | 9/2008 | Cameron .................... 430/281.1 |
| 2009/0286937 | A1 | | 11/2009 | Kamabuchi et al. |
| 2010/0047709 | A1 | * | 2/2010 | Echigo et al. .............. 430/270.1 |
| 2010/0316950 | A1 | | 12/2010 | Oguro et al. |
| 2010/0324255 | A1 | | 12/2010 | Kita et al. |
| 2012/0171611 | A1 | | 7/2012 | Ideno et al. |

FOREIGN PATENT DOCUMENTS

| JP | S60-099117 A | 6/1985 |
| JP | H02248417 A | 10/1990 |
| JP | H06-1741 A | 1/1994 |
| JP | 2000-143937 A | 5/2000 |
| JP | 2002-334869 A | 11/2002 |
| JP | 2004-511584 A | 4/2004 |
| JP | 2004-177668 A | 6/2004 |
| JP | 2004-271838 A | 9/2004 |
| JP | 2005-250434 A | 9/2005 |
| JP | 2007-226170 A | 9/2007 |
| JP | 2007-226204 A | 9/2007 |
| JP | 2008-88197 A | 4/2008 |
| JP | 2008-138128 A | 6/2008 |
| WO | 2004/066377 A1 | 8/2004 |
| WO | 2009/072465 A1 | 6/2009 |
| WO | 2011-034062 A1 | 3/2011 |

OTHER PUBLICATIONS

Hiraoka, Materials for Microlithography edited by Thompson, L. et al, ACS Symposium Series: American Chemical Society, Washington, DC 1985, pp. 339-360.*

English translation of JP,2008-138128 a (2008) from machine translation from AIPN Japan Patent Office National Center for Industrial Property Information and Training, generated Jun. 11, 2014, 9 pages.*

Hiraoka, H et al. IBM Res. Lab. Article or Chapter Title: Functionally substituted novolac resins: lithographic applications, radiation chemistry, and photooxidation; Journal or Book Title: Polymer Preprints (American Chemical Society, Division of Polymer Chemistry) vol. and Issue No. 25, pp. 322 Publication Date: 1984.*

(Continued)

*Primary Examiner* — Cynthia Hamilton
(74) *Attorney, Agent, or Firm* — Fitch, Even, Tabin & Flannery LLP

(57) ABSTRACT

There is provided a novel phenolic resin which can be used as a coating agent or a resist resin for a semiconductor, which has a high carbon concentration and a low oxygen concentration in the resin, which has a relatively high heat resistance and also a relatively high solvent solubility, and which can be applied to a wet process. There are also provided a material useful for forming a novel photoresist underlayer film which has a relatively high solvent solubility, which can be applied to a wet process, and which is excellent in etching resistance as an underlayer film for a multilayer resist, an underlayer film formed using the same, and a pattern forming method using the same. A resin of the present invention is obtained by reacting a compound having a specified structure and an aldehyde having a specified structure in the presence of an acidic catalyst. In addition, a material for forming an underlayer film for lithography of the present invention includes at least the resin and an organic solvent.

14 Claims, No Drawings

(56) References Cited

OTHER PUBLICATIONS

"Alkali (chemical compound)". Encyclopædia Britannica. Encyclopædia Britannica Online. Encyclopædia Britannica Inc., 2014. Web. Jun. 15, 2014 <http://www.britannica.com/EBchecked/topic/15573/alkali>.*

English translation of JP,2008-088197 a (2008) from machine translation from AIPN Japan Patent Office National Center for Industrial Property Information and Training, generated Jun. 15, 2014, 12 pages.*
International Search Report dated Jun. 26, 2012, issued in International Application PCT/JP2012/063995.

* cited by examiner

PHENOLIC RESIN AND MATERIAL FOR FORMING UNDERLAYER FILM FOR LITHOGRAPHY

CROSS-REFERENCE TO RELATED APPLICATIONS

This Application is a U.S. National Stage Application filed under 35 U.S.C. §371 of International Application PCT/JP2012/063995, filed May 30, 2012, designating the United States, which claims priority from Japanese Patent Application 2011-125029, filed Jun. 3, 2011, the complete disclosures of which are hereby incorporated herein by reference in their entirety for all purposes.

TECHNICAL FIELD

The present invention relates to a phenolic resin and a resin composition including the resin. The present invention also relates to a material for forming an underlayer film for lithography and an underlayer film for lithography, as well as a forming method of a photoresist pattern using the material for forming an underlayer film for lithography.

BACKGROUND ART

A reaction of phenols with formaldehyde in the presence of an acidic catalyst is generally known as a reaction for producing a phenol-novolac resin or the like. On the other hand, it has also been shown that a reaction with aldehydes such as acetoaldehyde, propionaldehyde, isobutyraldehyde, crotonaldehyde, and benzaldehyde produces polyphenols (see Patent Literature 1) and a novolac resin (see Patent Literature 2). In addition, it has also been shown that a reaction with hydroxybenzaldehyde having both properties of phenol and aldehyde can produce a novolac-type resin (see Patent Literature 3).

While the polyphenols and the novolac resin are used as a coating agent for a semiconductor and a resist resin, they are required for having heat resistance as one of properties in such applications.

On the other hand, as a composition for forming an antireflective film useful for microfabrication in a lithography process and suitable for manufacturing in particular an integrated circuit element, known is a composition for forming an antireflective film, containing a polymer (acenaphthene resin) having a structure represented by the following formula as a monomer unit, and a solvent (see Patent Literature 4).

[Formula 1]

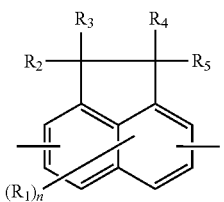

[wherein $R_1$ denotes a monovalent atom or group, n is an integer of 0 to 4, $R_2$ to $R_5$ independently denote a hydroxy group, or a monovalent atom or group.]

However, this technique in Patent Literature 4 has difficulties in that materials are expensive, the reaction conditions for obtaining the acenaphthene resin are stringent, and there are a large number of reaction steps and the reaction is complicate.

On the other hand, semiconductor devices are manufactured through microfabrication by lithography using a photoresist material, but are required to be made finer by a pattern rule in accordance with the increase in integration degree and the increase in speed of LSI in recent years. In lithography using light exposure, which is currently used as a general-purpose technique, the resolution is now approaching the intrinsic limitation associated with the wavelength of the light source.

A light source for lithography, for use in forming a resist pattern, has a shorter wavelength from a KrF excimer laser (248 nm) to an ArF excimer laser (193 nm). However, as the resist pattern is made finer and finer, there arise a problem of resolution and a problem of collapse of the resist pattern after development, and therefore there is demanded for making a resist film thinner. On the other hand, if the resist film is merely made thinner, it is difficult to achieve the resist pattern having a film thickness sufficient for processing a substrate. Accordingly, there is increasingly required a process in which not only the resist pattern but also a resist underlayer film is prepared between a resist and a semiconductor substrate to be processed and the resist underlayer film is allowed to have a function as a mask at the time of processing the substrate.

Currently, as the resist underlayer film for such a process, various ones are known. For example, in order to provide a resist underlayer film for lithography, having a selection ratio of dry etching rate close to the resist, unlike a conventional resist underlayer film having a high etching rate, there has been proposed a material for forming an underlayer film for multilayer resist process, containing a resin component having at least a substituent which releases a terminal group to form a sulfonic acid residue when a predetermined energy is applied, and a solvent (see Patent Literature 5). In addition, in order to provide a resist underlayer film for lithography, having a smaller selection ratio of dry etching rate than the resist, there has been proposed a resist underlayer film material including a polymer having a specified repeating unit (see Patent Literature 6). Furthermore, in order to provide a resist underlayer film for lithography, having a smaller selection ratio of dry etching rate than the semiconductor substrate, there has been proposed a resist underlayer film material including a polymer formed by co-polymerizing a repeating unit of acenaphthylene, and a substituted or non-substituted repeating unit having a hydroxy group (see Patent Literature 7).

On the other hand, as a material for allowing such a resist underlayer film to have a high etching resistance, an amorphous carbon underlayer film is known, which is formed by CVD using methane gas, ethane gas, acetylene gas, or the like as a raw material. However, there is demanded, in terms of process, a resist underlayer film material that can form a resist underlayer film in a wet process such as a spin coating method or screen printing.

In addition, as a material that is excellent in optical characteristics and etching resistance and that is capable of being dissolved in a solvent and being applied to a wet process, the present inventors have proposed a composition for forming an underlayer film for lithography, which contains a naphthalene formaldehyde polymer including a specified constituent unit, and an organic solvent (see Patent Literature 8). However, the technique in Patent Literature 8 is demanded to be improved in terms of etching resistance.

CITATION LIST

Patent Literatures

Patent Literature 1: Japanese Patent Laid-Open No. 06-1741
Patent Literature 2: National Publication of International Patent Application No. 2004-511584
Patent Literature 3: Japanese Patent Laid-Open No. 2008-88197
Patent Literature 4: Japanese Patent Laid-Open No. 2000-143937
Patent Literature 5: Japanese Patent Laid-Open No. 2004-177668
Patent Literature 6: Japanese Patent Laid-Open No. 2004-271838
Patent Literature 7: Japanese Patent Laid-Open No. 2005-250434
Patent Literature 8: International Publication No. WO 2009-072465

SUMMARY OF INVENTION

Technical Problem

As described above, many phenolic resins, materials for forming an underlayer film for lithography and underlayer films for lithography have been conventionally proposed, but there are no ones that not only can be applied to a wet process such as a spin coating method or screen printing and are relatively excellent in heat resistance, but also simultaneously satisfy etching resistance and solvent solubility at a high level, and thus a new material is required to be developed.

The present invention has been made in view of the above problems, and an object thereof is to provide a novel phenolic resin which has a relatively high carbon concentration and a relatively low oxygen concentration in the resin, which has a relatively high heat resistance and also a relatively high solvent solubility, and which can be applied to a wet process, as well as a composition including the resin.

In addition, another object of the present invention is to provide a resin useful for forming a novel photoresist underlayer film which has a relatively high solvent solubility, which can be applied to a wet process, and which is excellent in etching resistance as an underlayer film for a multilayer resist, a material for forming an underlayer film for lithography and an underlayer film for lithography using the resin, and a pattern forming method using the material for forming an underlayer film for lithography.

Solution to Problem

That is, the present invention provides the following [1] to [18].

[1]

A resin obtained by reacting a compound represented by formula (1) and/or (2) with an aldehyde represented by formula (3) and/or (4) in the presence of an acidic catalyst.

[Formula 2]

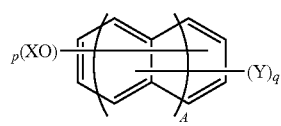

(1)

[Formula 3]

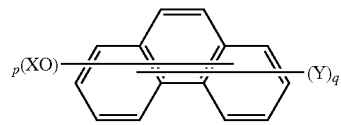

(2)

[in formulae (1) and (2), X represents a hydrogen atom, an alkyl group having 1 to 10 carbon atoms, an aryl group having 6 to 10 carbon atoms, or a cyclohexyl group, Y represents an alkyl group having 1 to 10 carbon atoms, an aryl group having 6 to 10 carbon atoms, or a cyclohexyl group, p represents a number of 1 to 3, q represents a number of 0 to 3, provided that when a plurality of Xs and Ys are present, Xs and Ys may be each the same or different, and A in formula (1) represents a number of 0 to 2, preferably represents a number of 0 to 1.]

[Formula 4]

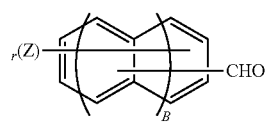

(3)

[Formula 5]

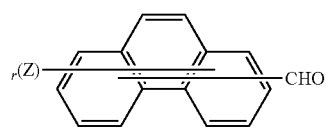

(4)

[in formulae (3) and (4), Z represents an alkyl group having 1 to 10 carbon atoms, an aryl group having 6 to 10 carbon atoms, a cyclohexyl group, a hydroxyl group, a formyl group, or a carbonyl group, r represents a number of 0 to 6, provided that when a plurality of Zs are present, Zs may be each the same or different, and B in formula (3) represents a number of 0 to 2, preferably represents a number of 0 to 1.]

[2]

The resin according to [1], wherein the compound represented by the formula (1) is at least one selected from the group consisting of phenols, catechols, hydroquinones, cresols, ethylphenols, propylphenols, butylphenols, phenylphenols, methylcatechols, methylhydroquinones, naphthols, dihydroxynaphthalenes, hydroxyanthracenes, dihydroxyanthracenes, trihydroxyanthracenes, and tetrahydroxyanthracenes.

[3]

The resin according to [1], wherein A in the formula (1) is 0 or 1.

[4]

The resin according to [1], wherein the compound represented by the formula (2) is at least one selected from the group consisting of phenanthrols, methyl phenanthrols, dimethyl phenanthrols, and dihydroxy phenanthrols.

[5]

The resin according to any one of [1] to [4], wherein the aldehyde represented by the formula (3) is at least one selected from the group consisting of benzaldehydes, methylbenzaldehydes, ethylbenzaldehydes, propylbenzaldehydes, butylbenzaldehydes, cyclohexylbenzaldehydes, biphenylaldehydes, hydroxybenzaldehydes, dihydroxybenzaldehydes, naphthaldehydes, hydroxynaphthaldehydes, and anthracenecarboxyaldehydes.

[6]

The resin according to any one of [1] to [4], wherein the aldehyde represented by the formula (4) is at least one selected from the group consisting of phenanthrenecarbaldehydes, methylphenanthrenecarbaldehydes, dimethylphenanthrenecarbaldehydes, hydroxyphenanthrenecarbaldehydes, and dihydroxyphenanthrenecarbaldehydes.

[7]

The resin according to any one of [1] to [6], wherein the acidic catalyst is at least one selected from the group consisting of hydrochloric acid, sulfuric acid, phosphoric acid, oxalic acid, malonic acid, succinic acid, adipic acid, sebacic acid, citric acid, fumaric acid, maleic acid, formic acid, p-toluenesulfonic acid, methanesulfonic acid, trifluoroacetic acid, dichloroacetic acid, trichloroacetic acid, trifluoromethanesulfonic acid, benzenesulfonic acid, naphthalenesulfonic acid, naphthalenedisulfonic acid, zinc chloride, aluminum chloride, iron chloride, boron trifluoride, tungstosilicic acid, tungstophosphoric acid, silicomolybdic acid, phosphomolybdic acid, hydrobromic acid, and hydrofluoric acid.

[8]

The resin according to any one of [1] to [7], including a structure represented by the following formula (5), (6), (7) and/or (8).

[Formula 6]

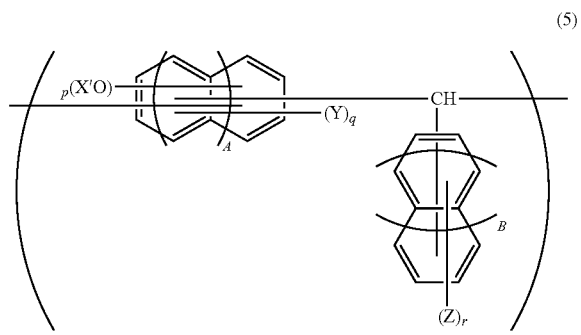

(5)

[Formula 7]

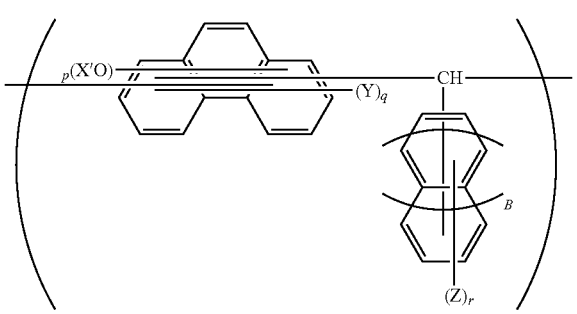

(6)

[Formula 8]

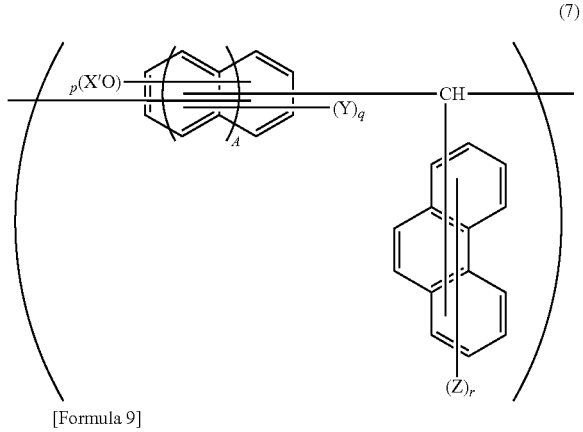

(7)

[Formula 9]

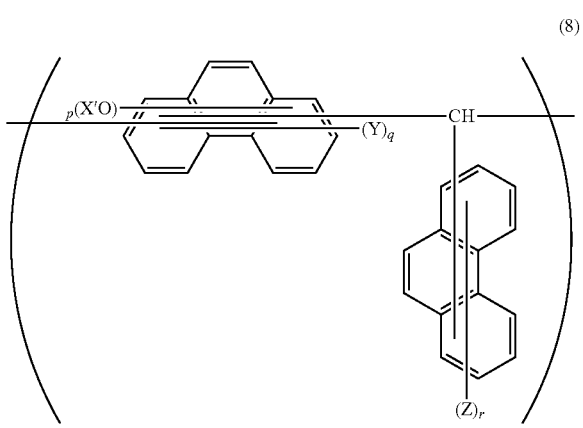

(8)

(wherein all of Y, Z, p, q, r, A, and B are the same as those described in the formulae (1), (2), (3) and (4), and X' is the same as X in the formula (1) or (2), or a single bond forming a direct bond with X, Y, Z, or an aromatic ring in the resin.)

[9]

The resin according to any one of [1] to [8], wherein the carbon concentration is 80 to 99.9% by mass.

[10]

The resin according to any one of [1] to [9], having a solubility in propylene glycol monomethyl ether acetate of 10% by mass or more.

[11]

A resin composition including the resin according to any one of [1] to [10].

[12]

The resin composition according to [11], further including an organic solvent.

[13]

The resin composition according to [11] or [12], further including an acid generator.

[14]

The resin composition according to any one of [11] to [13], further including a crosslinking agent.

[15]

A material for forming an underlayer film for lithography, including the resin composition according to any one of [11] to [14].

[16]

An underlayer film for lithography, formed from the material for forming an underlayer film for lithography according to [15].

[17]

A pattern forming method including forming an underlayer film on a substrate by using the material for forming an underlayer film for lithography according to [15], forming at least one photoresist layer on the underlayer film, then irradiating a required region of the photoresist layer with radiation, and developing it with an alkali.

[18]

A pattern forming method including forming an underlayer film on a substrate by using the material for forming an underlayer film for lithography according to [15], forming an intermediate layer film on the underlayer film by using a silicon atom-containing resist intermediate layer film material, forming at least one photoresist layer on the intermediate layer film, then irradiating a required region of the photoresist layer with radiation, developing it with an alkali to form a resist pattern, and then etching the intermediate layer film with the resist pattern as a mask, etching the underlayer film with the obtained intermediate layer film pattern as an etching mask and etching the substrate with the obtained underlayer film pattern as an etching mask, to form a pattern on the substrate.

Advantageous Effects of Invention

According to the present invention, it is possible to provide a novel phenolic resin that not only has a relatively high carbon concentration and a relatively low oxygen concentration, and a relatively high heat resistance, but also has a relatively high solvent solubility and can be applied to a wet process. Therefore, the phenolic resin is useful as a resin for use in, for example, an electric insulating material; a resist resin; a sealing resin for a semiconductor; an adhesive for a printed wiring board; a matrix resin for an electric laminated board mounted on electrical equipment, electronic equipment, industrial equipment and the like; a matrix resin for a prepreg mounted on electrical equipment, electronic equipment, industrial equipment and the like; a material for a build-up laminated board; a resin for fiber-reinforced plastics; a sealing resin for a liquid crystal display panel; a paint; various coating agents; an adhesive; a coating agent for a semiconductor; and a resist resin for a semiconductor.

According to the present invention, it is also possible to provide a material for forming an underlayer film for lithography useful for forming a photoresist underlayer film which has a relatively high solvent solubility, which can be applied to a wet process, and which is excellent in etching resistance. The material for forming an underlayer film for lithography is used to thereby make it possible to form an underlayer film also excellent in etching resistance to oxygen plasma etching and the like, and further to obtain an excellent resist pattern because the underlayer film is also excellent in adhesiveness with a resist layer.

DESCRIPTION OF EMBODIMENTS

Hereinafter, embodiments of the present invention will be described. It is to be noted that the following embodiments are illustrative for describing the present invention, and the present invention is not limited only to the embodiments.

[Phenolic Resin]

A phenolic resin of the present embodiment is a resin obtained by reacting the compound represented by the formula (1) and/or (2) with the aldehyde represented by the formula (3) and/or (4) in the presence of an acidic catalyst.

Herein, the compound represented by the formula (1) encompasses those in which p number of substituent(s)-OX and q number of substituent(s)-Y are introduced into a benzene ring (in the case where A=0), a naphthalene ring (in the case where A=1), or an anthracene ring (in the case where A=2).

While the compound represented by the formula (1) depends on the type of the aldehyde represented by the formula (3) and/or (4) to be reacted therewith, the larger number of A tends to increase the carbon concentration of a resin to be obtained, thereby improving the etching resistance and the heat resistance of an underlayer film for lithography to be obtained by using the resin, and the smaller number of A tends to increase the solvent solubility of a resin to be obtained. Therefore, the number of A may be appropriately set in consideration of the balance of these properties and is not particularly limited, but is preferably a number of 0 to 1 from the viewpoint of simultaneously satisfying the carbon concentration or the etching resistance and the solvent solubility at a high level.

On the other hand, the compound represented by the formula (2) is one in which p number of substituent(s)-OX and q number of substituent(s)-Y are introduced into a phenanthrene ring.

In the formulae (1) and (2), at least one X is preferably a hydrogen atom. Furthermore, in the formulae (1) and (2), in the case where there is(are) substituent(s), the solubility tends to be increased, and in the case where the carbon concentration is higher, the etching resistance tends to be improved. Therefore, the number of the substituents and the types thereof can be appropriately set in consideration of the balance of these properties and are not particularly limited, but in the formulae (1) and (2), p is preferably a number of 1 to 2 and more preferably 1, and q is preferably a number of 0 to 2 and more preferably a number of 0 to 1.

Specific examples of a phenol derivative represented by the formula (1) include phenol, catechol, resorcinol, hydroquinone, cresol, ethylphenol, propylphenol, butylphenol, phenylphenol, methylcatechol, methylresorcinol, methylhydroquinone, naphthol, methylnaphthol, dihydroxynaphthalene, methyldihydroxynaphthalene, hydroxyanthracene, dihydroxyanthracene, trihydroxyanthracene, and tetrahydroxyanthracene, but are not limited thereto. Among them, phenols, catechols, hydroquinones, cresols, ethylphenols, propylphenols, butylphenols, phenylphenols, methylcatechols, methylhydroquinones, naphthols, dihydroxynaphthalenes, hydroxyanthracenes, dihydroxyanthracenes, trihydroxyanthracenes, and tetrahydroxyanthracenes are preferable. Herein, the phenols are meant to encompass phenol and a substituted phenol (having the above p number of substituent(s)-OX and q number of substituent(s)-Y), the naphthols are meant to encompass naphthol and a substituted naphthol (having the above p number of substituent(s)-OX and q number of substituent(s)-Y), and the same is true in others. Among the phenol derivatives, a phenol derivative including a conjugated structure involving at least two unshared electron pairs of the benzene ring is excellent in heat resistance, optical characteristics, and the like, and thus phenylphenol, naphthol, methylnaphthol, dihydroxynaphthalene, methyldihydroxynaphthalene, hydroxyanthracene, dihydroxyanthracene, trihydroxyanthracene, and tetrahydroxyanthracene are more preferable.

In addition, specific examples of a phenol derivative represented by the formula (2) include phenanthrols, methyl phenanthrols, dimethyl phenanthrols, and dihydroxy phenanthrols, but are not particularly limited thereto. Herein, the phenanthrols are meant to encompass phenanthrol and a substituted phenanthrol (having the above p number of substituent(s)-OX and q number of substituent(s)-Y), and the same is true in others.

The above phenol derivatives can be used alone, or two or more thereof can be used in combination.

Meanwhile, the aldehyde represented by the formula (3) encompasses those in which one aldehyde group and r number of substituent(s)-Z are introduced into a benzene ring (in the case where B=0), a naphthalene ring (in the case where B=1), or an anthracene ring (in the case where B=2). While the compound represented by the formula (3) depends on the type of the compound represented by formula (1) and/or (2) to be reacted therewith, the larger number of B tends to increase the carbon concentration of a resin to be obtained, thereby improving the etching resistance and the heat resistance of an underlayer film for lithography to be obtained by using the resin, and the smaller number of B increases the solvent solubility of a resin to be obtained. Therefore, the number of B may be appropriately set in consideration of the balance of these properties and is not particularly limited, but is preferably a number of 0 to 1 from the viewpoint of simultaneously satisfying the carbon concentration or the etching resistance and the solvent solubility at a high level.

On the other hand, the aldehyde represented by the formula (4) is one in which one aldehyde group and r number of substituent(s)-Z are introduced into a phenanthrene ring.

In the formulae (3) and (4), r is preferably a number of 0 to 4 and more preferably a number of 0 to 2. Furthermore, in the formulae (3) and (4), in the case where there is(are) substituent(s), the solubility tends to be increased, and in the case where the carbon concentration is higher, the etching resistance tends to be improved. Therefore, the number of the substituents and the types thereof can be appropriately set in consideration of the balance of these properties and are not particularly limited, provided that in the formula (3), when B is 0, r is preferably a number of 1 to 2 and more preferably 1.

Specific examples of the aldehyde represented by the formula (3) include benzaldehyde, methylbenzaldehyde, dimethylbenzaldehyde, ethylbenzaldehyde, propylbenzaldehyde, butylbenzaldehyde, cyclohexylbenzaldehyde, biphenylaldehyde, hydroxybenzaldehyde, dihydroxybenzaldehyde, naphthaldehyde, methylnaphthaldehyde, dimethylnaphthaldehyde, hydroxynaphthaldehyde, dihydroxynaphthaldehyde, and anthracenecarboxyaldehyde, but are not particularly limited thereto. Among them, benzaldehydes, methylbenzaldehydes, ethylbenzaldehydes, propylbenzaldehydes, butylbenzaldehydes, cyclohexylbenzaldehydes, biphenylaldehydes, hydroxybenzaldehydes, dihydroxybenzaldehydes, naphthaldehydes, hydroxynaphthaldehydes, and anthracenecarboxyaldehydes are preferable. Herein, the benzaldehydes are meant to encompass benzaldehyde and a substituted benzaldehyde (having the above r number of substituent(s)-Z), and the same is true in others. Among the aldehydes, an aldehyde including a conjugated structure involving at least two unshared electron pairs of the benzene ring is excellent in heat resistance, optical characteristics, and the like, and thus biphenylaldehyde, naphthaldehyde, methylnaphthaldehyde, dimethylnaphthaldehyde, hydroxynaphthaldehyde, dihydroxynaphthaldehyde, and anthracenecarboxyaldehyde are more preferable.

In addition, specific examples of the aldehyde represented by the formula (4) include phenanthrenecarbaldehydes, methylphenanthrenecarbaldehydes, dimethylphenanthrenecarbaldehydes, hydroxyphenanthrenecarbaldehydes, and dihydroxyphenanthrenecarbaldehydes, but are not particularly limited thereto. Herein, the phenanthrenecarbaldehydes are meant to encompass phenanthrenecarbaldehyde and a substituted phenanthrenecarbaldehyde (having the above r number of substituent(s)-Z), and the same is true in others.

The above aldehydes can be used alone, or two or more thereof can be used in combination.

When the phenol derivative represented by the formula (1) and/or (2) and the aldehyde represented by the formula (3) or (4) are reacted with each other, the molar ratio thereof can be appropriately set depending on the desired properties, and is not particularly limited, but the ratio of phenol derivative: aldehyde is preferably 1:0.1 to 1:6, more preferably 1:0.2 to 1:6, further preferably 1:0.3 to 1:5, particularly preferably 1:0.3 to 1:4, and most preferably 1:0.3 to 1:3. The molar ratio of the phenol derivative represented by the formula (1) and/or (2) and the aldehyde represented by formula (3) and/or (4) is set within the above preferable range to thereby make it possible to keep the resin yield of a resin to be obtained relatively high, and to decrease the amount of the remaining unreacted raw materials, and thus productivity and economic efficiency tend to be enhanced.

A condensation reaction of the phenol derivative represented by the formula (1) and/or (2) and the aldehyde represented by formula (3) and/or (4) is not particularly limited in terms of reaction conditions other than such a condition that the reaction is performed in the presence of an acidic catalyst, and can be performed while the reaction conditions being appropriately set. For example, the condensation reaction can be performed under ordinary pressure with being heated to reflux at a temperature equal to or higher than a temperature where raw materials used are compatible with each other (usually 80 to 250° C.), or with generated water being distilled off. The condensation reaction can also be performed under pressure, if necessary.

Furthermore, if necessary, a solvent can also be used, which is inert to the condensation reaction. Examples of the solvent include saturated aliphatic hydrocarbons such as heptane and hexane; alicyclic hydrocarbons such as cyclohexane; ethers such as dioxane and dibutyl ether; alcohols such as 2-propanol; ketones such as methyl isobutyl ketone; and carboxylic acids such as acetic acid, but are not particularly limited thereto. These solvents can be used alone or two or more thereof can be used in combination.

The acidic catalyst that can be used for the above condensation reaction can be appropriately selected from known ones and used, and is not particularly limited. Such an acidic catalyst is an inorganic acid or an organic acid, as widely known, and specific examples thereof include inorganic acids such as hydrochloric acid, sulfuric acid, phosphoric acid, hydrobromic acid, or hydrofluoric acid, organic acids such as oxalic acid, malonic acid, succinic acid, adipic acid, sebacic acid, citric acid, fumaric acid, maleic acid, formic acid, p-toluenesulfonic acid, methanesulfonic acid, trifluoroacetic acid, dichloroacetic acid, trichloroacetic acid, trifluoromethanesulfonic acid, benzenesulfonic acid, naphthalenesulfonic acid, or naphthalenedisulfonic acid, Lewis acids such as zinc chloride, aluminum chloride, iron chloride, or boron trifluoride, or solid acids such as tungstosilicic acid, tungstophosphoric acid, silicomolybdic acid, or phosphomolybdic acid, but are not particularly limited thereto. Among them, in terms of production, preferable are inorganic acids, sulfonic acids, and tungstic acids, and more preferable are oxalic acid, citric acid, p-toluenesulfonic acid, methanesulfonic acid, trifluoromethanesulfonic acid, benzenesulfonic acid, naphthalenesulfonic acid, naphthalenedisulfonic acid, and tungstophosphoric acid.

The amount of the acidic catalyst to be used can be appropriately set depending on the types of raw materials to be used and the catalyst to be used, reaction conditions, and the like, and is not particularly limited, but the amount is preferably 0.01 to 100 parts by mass, more preferably 0.01 to 20 parts by mass, and further preferably 0.1 to 10 parts by mass, based on 100 parts by mass of the total amount of the phenol derivative represented by the formula (1) and/or (2) and the aldehyde represented by formula (3) and/or (4). The amount of the catalyst to be used is set within the above preferable range to thereby easily achieve an appropriate reaction rate, and further to result in a tendency to suppress the increase in resin viscosity due to a high reaction rate.

The reaction time is not particularly limited, but is preferably 1 to 10 hours, and more preferably about 2 to 8 hours. The reaction time is set within the above preferable range to result in a tendency to achieve a resin having objective properties in an economically and industrially advantageous manner.

After completion of the reaction, the obtained resin can be taken out (isolated) according to an ordinary method and the method is not particularly limited. For example, an objective phenolic resin can be obtained by further adding the solvent to a reaction product liquid, if necessary, for dilution, then leaving the resultant to stand to thereby separate it to two phases, separating a resin phase, oily phase, from an aqueous phase, then washing it with water to thereby remove the acidic catalyst completely, and removing the added solvent and the unreacted modifying agent by a common method such as distillation.

The phenolic resin that can be obtained as described above preferably has a structure represented by the following formula (5), (6), (7) and/or (8).

[Formula 10]

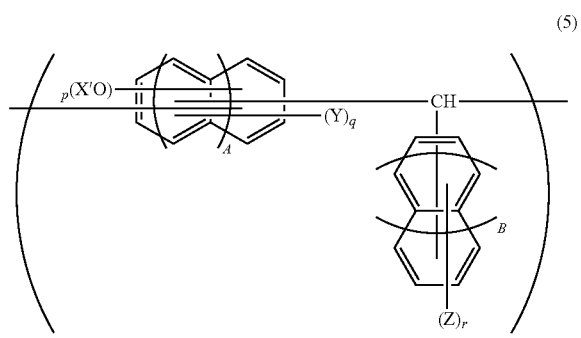

(5)

[Formula 11]

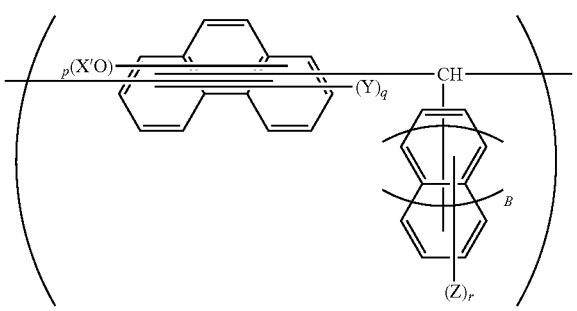

(6)

[Formula 12]

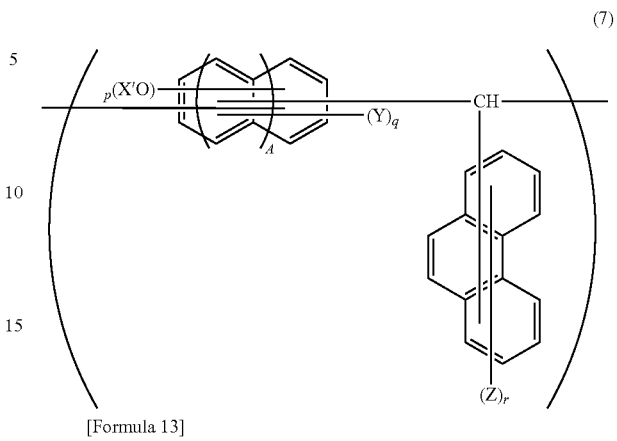

(7)

[Formula 13]

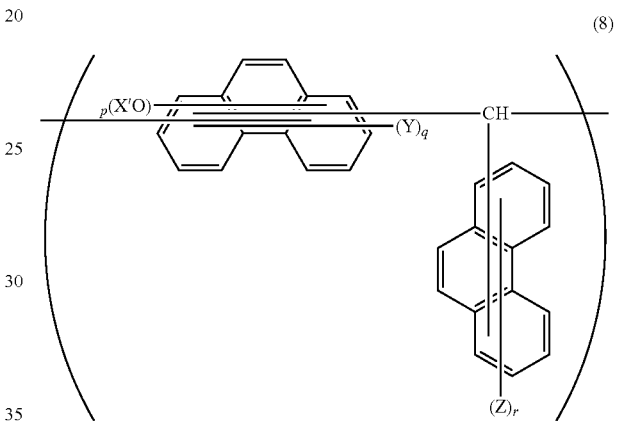

(8)

(in the above formulae, all of Y, Z, p, q, and r are the same as those described in the formulae (1), (2), (3), and (4), X' is the same as X in the formula (1) or (2), or a single bond forming a direct bond with X, Y, Z, or an aromatic ring in the resin. A and B also represent a number of 0 to 2 as in the formulae (1) and (3), and preferable is a case where both of A and B are a number of 0 to 1.)

The carbon concentration in the phenolic resin of the present embodiment is not particularly limited, but it is preferably 80 to 99.9% by mass, more preferably 85 to 99.9% by mass, and further preferably 90 to 99.9% by mass, from the viewpoint of improving the heat resistance.

In addition, the oxygen concentration in the phenolic resin of the present embodiment is not particularly limited, but it is preferably 0 to 10% by mass, more preferably 0 to 7% by mass, and further preferably 0 to 5% by mass, from the viewpoint of improving the heat resistance.

Herein, the carbon concentration and the oxygen concentration in the resin mean carbon and oxygen included in the resin based on % by mass, respectively.

The molecular weight of the phenolic resin of the present embodiment is not particularly limited, but the weight average molecular weight (Mw) thereof is preferably 600 to 10,000, more preferably 650 to 10,000, further preferably 700 to 5,000, and particularly preferably 750 to 4000. The weight average molecular weight is set within the above preferable range to result in tendencies to increase the solvent solubility and also to suppress the increase in viscosity in a wet process, and further to result in tendencies to improve the heat resistance and to reduce outgas properties. Similarly, the number average molecular weight (Mn) thereof is preferably 400 to 8,000, more preferably 450 to 8,000, further preferably 500 to 5,000, and particularly preferably 600 to 4,000. Herein, the degree of dispersion, Mw/Mn, is preferably 2 or less, more preferably 1.70 or less, and further preferably 1.50 or less.

The phenolic resin of the present embodiment preferably has a smaller amount of the residual metals therein from the viewpoint of suppressing metallic contamination in the case of being used in, for example, electronic material applications. Specifically, the amount of the residual metals is preferably 1000 ppb by mass or less, more preferably 100 ppb by mass or less, and further preferably 50 ppb by mass or less. It is to be noted that the amount of the residual metals in the resin can be reduced by a known method. Examples of such a method include a method of washing a resin solution with ultrapure water or the like and a method of bringing a resin solution into contact with an ion-exchange resin, but are not particularly limited thereto.

In the case where the phenolic resin has a phenolic hydroxyl group, an epoxy group can be introduced into the phenolic hydroxyl group, thereby making it possible to further improve the curability of the resin, and to further reduce outgas properties. Herein, the epoxy group can be introduced by a known method, but the method is not particularly limited. For example, the epoxy group can be introduced into the phenolic resin by reacting the phenolic resin having the phenolic hydroxyl group with an epoxy-containing compound such as epichlorohydrin, and subjecting them to a basic action.

The phenolic resin preferably has a high solubility in a solvent. More specifically, the phenolic resin preferably has a solubility in propylene glycol monomethyl ether acetate of 10% by mass or more. Herein, the solubility in propylene glycol monomethyl ether acetate is defined as "Mass of resin/(Mass of resin+Mass of solvent)×100 (% by mass)". For example, in the case where 10 g of the phenolic resin is dissolved in 90 g of propylene glycol monomethyl ether acetate, the solubility of the phenolic resin in propylene glycol monomethyl ether acetate is "10% by mass or more", and in the case where the phenolic resin is not dissolved, the solubility is "less than 10% by mass".

[Resin Composition]

A resin composition of the present embodiment includes the above phenolic resin. Herein, the resin composition of the present embodiment may, if necessary, include an organic solvent. In addition, the resin composition of the present embodiment may, if necessary, include other components such as a crosslinking agent and an acid generator. Other components such as an organic solvent, a crosslinking agent, and an acid generator will be described in the following section of Material for Forming Underlayer Film for Lithography, and thus their overlapped description is herein omitted.

[Material for Forming Underlayer Film for Lithography]

A material for forming an underlayer film for lithography of the present embodiment includes at least the above phenolic resin and an organic solvent. The phenolic resin is a resin obtained by reacting the compound represented by formula (1) and/or (2) with the aldehyde represented by formula (3) and/or (4) in the presence of the acidic catalyst.

In the material for forming an underlayer film for lithography of the present embodiment, the content of the phenolic resin is not particularly limited, but it is preferably 1 to 33 parts by mass, more preferably 2 to 25 parts by mass, and further preferably 3 to 20 parts by mass, based on 100 parts by mass of the entire amount including the amount of the organic solvent.

The organic solvent that can be used in the material for forming an underlayer film for lithography of the present embodiment is not particularly limited as long as it can dissolve at least the above phenolic resin, and a known one can be appropriately used therefor.

Specific examples of the organic solvent include ketone-based solvents such as acetone, methyl ethyl ketone, methyl isobutyl ketone, and cyclohexanone, cellosolve-based solvents such as propylene glycol monomethyl ether and propylene glycol monomethyl ether acetate, ester-based solvents such as ethyl lactate, methyl acetate, ethyl acetate, butyl acetate, isoamyl acetate, ethyl lactate, methyl methoxypropionate, and methyl hydroxyisobutyrate, alcohol-based solvents such as methanol, ethanol, isopropanol, and 1-ethoxy-2-propanol, and aromatic hydrocarbons such as toluene, xylene, and anisole, but are not particularly limited thereto. These organic solvents can be used alone, or two or more thereof can be used in combination.

Among the above organic solvents, preferable are cyclohexanone, propylene glycol monomethyl ether, propylene glycol monomethyl ether acetate, ethyl lactate, methyl hydroxyisobutyrate, anisole, and the like, in terms of safety.

In the material for forming an underlayer film for lithography of the present embodiment, the content of the organic solvent is not particularly limited, but it is preferably 100 to 10,000 parts by mass and more preferably 200 to 5,000 parts by mass based on 100 parts by mass of the phenolic resin, in terms of solubility and film formability.

The material for forming an underlayer film for lithography of the present embodiment may contain, if necessary, a crosslinking agent from the viewpoint of suppressing intermixing and the like.

The crosslinking agent includes a melamine compound, a guanamine compound, a glycoluril compound or a urea compound, an epoxy compound, a thioepoxy compound, an isocyanate compound, an azide compound, and a compound including a double bond such as an alkenyl ether group, these compounds being substituted with at least one selected from a methylol group, an alkoxymethyl group, and an acyloxymethyl group, but are not particularly limited thereto. Herein, these crosslinking agents can be used alone, or two or more thereof can be used in combination. While such a crosslinking agent may also be used as an additive, such a crosslinkable group may also be introduced into a polymer side chain as a pendant group. A compound including a hydroxy group can also be used as the crosslinking agent.

Specific examples of the melamine compound include hexamethylolmelamine, hexamethoxymethylmelamine, a compound in which 1 to 6 methylol groups in hexamethylolmelamine are methoxymethylated, or mixtures thereof, and hexamethoxyethylmelamine, hexaacyloxymethylmelamine, a compound in which 1 to 6 methylol groups in hexamethylolmelamine are acyloxymethylated, or mixtures thereof. Specific examples of the epoxy compound include tris(2,3-epoxypropyl)isocyanurate, trimethylolmethane triglycidyl ether, trimethylolpropane triglycidyl ether, and triethylolethane triglycidyl ether.

Specific examples of the guanamine compound include tetramethylolguanamine, tetramethoxymethylguanamine, a compound in which 1 to 4 methylol groups in tetramethylolguanamine are methoxymethylated, or mixtures thereof, and tetramethoxyethylguanamine, tetraacyloxyguanamine, a compound in which 1 to 4 methylol groups in tetramethylolguanamine are acyloxymethylated, or mixtures thereof. Specific examples of the glycoluril compound include tetramethylolglycoluril, tetramethoxyglycoluril, tetramethoxymethylglycoluril, a compound in which 1 to 4 methylol groups in tetramethylolglycoluril are methoxymethylated, or mixtures thereof, and a compound in which 1 to 4 methylol groups in tetramethylolglycoluril are acyloxymethylated, or mixtures thereof. Specific examples of the urea compound include tetramethylolurea, tetramethoxymethylurea, a compound in which 1 to 4 methylol groups in tetramethylolurea are methoxymethylated, or mixtures thereof, and tetramethoxyethylurea.

Specific examples of the compound including an alkenyl ether group include ethylene glycol divinyl ether, triethylene glycol divinyl ether, 1,2-propanediol divinyl ether, 1,4-butanediol divinyl ether, tetramethylene glycol divinyl ether, neopentyl glycol divinyl ether, trimethylolpropane trivinyl ether, hexanediol divinyl ether, 1,4-cyclohexanediol divinyl ether, pentaerythritol trivinyl ether, pentaerythritol tetravinyl ether, sorbitol tetravinyl ether, sorbitol pentavinyl ether, and trimethylolpropane trivinyl ether.

In the material for forming an underlayer film for lithography of the present embodiment, the content of the crosslinking agent is not particularly limited, but it is preferably 5 to 50 parts by mass and more preferably 10 to 40 parts by mass based on 100 masses of the phenolic resin. The content is set within the above preferable range to result in tendencies to suppress the occurrence of the mixing phenomenon with the resist layer, and to result in tendencies to enhance an antireflective effect and improve film formability after crosslinking.

The material for forming an underlayer film for lithography of the present embodiment may also contain, if necessary, an acid generator from the viewpoint of further promoting a crosslinking reaction by heat. As the acid generator, one for generating an acid by pyrolysis and one for generating an acid by light irradiation are known in the art, and any of them can be used.

The acid generator includes:

1) an onium salt of the following general formula (P1a-1), (P1a-2), (P1a-3) or (P1b), 2) a diazomethane derivative of the following general formula (P2), 3) a glyoxime derivative of the following general formula (P3), 4) a bissulfone derivative of the following general formula (P4), 5) a sulfonic acid ester of an N-hydroxyimide compound of the following general formula (P5), 6) a β-ketosulfonic acid derivative, 7) a disulfone derivative, 8) a nitrobenzylsulfonate derivative, and 9) a sulfonic acid ester derivative, but is not particularly limited thereto. Herein, these acid generators can be used alone, or two or more thereof can be used in combination.

[Formula 14]

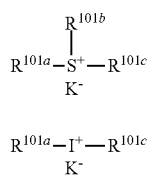

(P1a-1)

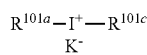

(P1a-2)

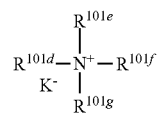

(P1a-3)

In the above formulae, each of $R^{101a}$, $R^{101b}$ and $R^{101c}$ independently represents a straight, branched or cyclic alkyl group, alkenyl group, oxoalkyl group or oxoalkenyl group having 1 to 12 carbon atoms, an aryl group having 6 to 20 carbon atoms, or an aralkyl group or aryloxoalkyl group having 7 to 12 carbon atoms, and a part or all of hydrogen atoms of these groups may be substituted with an alkoxy group or the like. In addition, $R^{101b}$ and $R^{101c}$ may form a ring, and if forming a ring, each of $R^{101b}$ and $R^{101c}$ independently represents an alkylene group having 1 to 6 carbon atoms. $K^-$ represents a non-nucleophilic counter ion. $R^{101d}$, $R^{101e}$, $R^{101f}$ and $R^{101g}$ are represented by each independently adding a hydrogen atom to $R^{101a}$, $R^{101b}$ and $R^{101c}$. $R^{101d}$ and $R^{101e}$, and $R^{101d}$, $R^{101e}$ and $R^{101f}$ may form a ring, and if forming a ring, $R^{101d}$ and $R^{101e}$, and $R^{101d}$, $R^{101e}$ and $R^{101f}$ represent an alkylene group having 3 to 10 carbon atoms, or a heteroaromatic ring having therein the nitrogen atom(s) in the formula.

$R^{101a}$, $R^{101b}$, $R^{101c}$, $R^{101d}$, $R^{101e}$, $R^{101f}$ and $R^{101g}$ described above may be the same or different from one another. Specifically, the alkyl group includes a methyl group, an ethyl group, a propyl group, an isopropyl group, a n-butyl group, a sec-butyl group, a tert-butyl group, a pentyl group, a hexyl group, a heptyl group, an octyl group, a cyclopentyl group, a cyclohexyl group, a cycloheptyl group, a cyclopropylmethyl group, a 4-methyl cyclohexyl group, a cyclohexylmethyl group, a norbornyl group, and an adamantyl group. The alkenyl group includes a vinyl group, an allyl group, a propenyl group, a butenyl group, a hexenyl group, and a cyclohexenyl group. The oxoalkyl group includes a 2-oxocyclopentyl group and a 2-oxocyclohexyl group, and can include a 2-oxopropyl group, a 2-cyclopentyl-2-oxoethyl group, a 2-cyclohexyl-2-oxoethyl group, and a 2-(4-methylcyclohexyl)-2-oxoethyl group. The oxoalkenyl group includes a 2-oxo-4-cyclohexenyl group and a 2-oxo-4-propenyl group. The aryl group includes a phenyl group, a naphthyl group, alkoxyphenyl groups such as a p-methoxyphenyl group, a m-methoxyphenyl group, an o-methoxyphenyl group, an ethoxyphenyl group, a p-tert-butoxyphenyl group, and a m-tert-butoxyphenyl group, alkylphenyl groups such as a 2-methylphenyl group, a 3-methylphenyl group, a 4-methylphenyl group, an ethylphenyl group, a 4-tert-butylphenyl group, a 4-butylphenyl group, and a dimethylphenyl group, alkylnaphthyl groups such as a methylnaphthyl group and an ethylnaphthyl group, alkoxynaphthyl groups such as a methoxynaphthyl group and an ethoxynaphthyl group, dialkylnaphthyl groups such as a dimethylnaphthyl group and a diethylnaphthyl group, and dialkoxynaphthyl groups such as a dimethoxynaphthyl group and a diethoxynaphthyl group. The aralkyl group includes a benzyl group, a phenylethyl group, and a phenethyl group. The aryloxoalkyl group includes 2-aryl-2-oxoethyl groups such as a 2-phenyl-2-oxoethyl group, a 2-(1-naphthyl)-2-oxoethyl group, and a 2-(2-naphthyl)-2-oxoethyl group. The non-nucleophilic counter ion, $K^-$, includes halide ions such as a chloride ion and a bromide ion, fluoroalkyl sulfonates such as triflate, 1,1,1-trifluoroethane sulfonate, and nonafluorobutane sulfonate, aryl sulfonates such as tosylate, benzene sulfonate, 4-fluorobenzene sulfonate, and 1,2,3,4,5-pentafluorobenzene sulfonate, and alkyl sulfonates such as mesylate and butane sulfonate.

In the case where $R^{101d}$, $R^{101e}$, $R^{101f}$ and $R^{101g}$ are each a heteroaromatic ring having the nitrogen atom(s) in the formula, examples of the heteroaromatic ring include imidazole derivatives (for example, imidazole, 4-methylimidazole, and 4-methyl-2-phenylimidazole), pyrazole derivatives, furazan derivatives, pyrroline derivatives (for example, pyrroline and 2-methyl-1-pyrroline), pyrrolidine derivatives (for example, pyrrolidine, N-methylpyrrolidine, pyrrolidinone, and N-methylpyrrolidone), imidazoline derivatives, imidazolidine derivatives, pyridine derivatives (for example, pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (for example, quinoline and 3-quinolinecarbonitrile), isoquinoline derivatives, cinnoline derivatives, quinazoline derivatives, quinoxaline derivatives, phthalazine derivatives, purine derivatives, pteridin derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivative, and uridine derivatives.

While the general formula (P1a-1) and the general formula (P1a-2) have both effects of a photo acid generator and a thermal acid generator, the general formula (P1a-3) acts as a thermal acid generator.

[Formula 15]

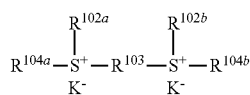

(P1b)

In the formula (P1b), each of $R^{102a}$ and $R^{102b}$ independently represents a straight, branched or cyclic alkyl group having 1 to 8 carbon atoms. $R^{103}$ represents a straight, branched or cyclic alkylene group having 1 to 10 carbon atoms. Each of $R^{104a}$ and $R^{104b}$ independently represents a 2-oxoalkyl group having 3 to 7 carbon atoms. K$^-$ represents a non-nucleophilic counter ion.

Specific examples of $R^{102a}$ and $R^{102b}$ include a methyl group, an ethyl group, a propyl group, an isopropyl group, a n-butyl group, a sec-butyl group, a tert-butyl group, a pentyl group, a hexyl group, a heptyl group, an octyl group, a cyclopentyl group, a cyclohexyl group, a cyclopropylmethyl group, a 4-methyl cyclohexyl group, and a cyclohexylmethyl group. $R^{103}$ includes a methylene group, an ethylene group, a propylene group, a butylene group, a pentylene group, a hexylene group, a heptylene group, an octylene group, a nonylene group, a 1,4-cyclohexylene group, a 1,2-cyclohexylene group, a 1,3-cyclopentylene group, a 1,4-cyclooctylene group, and a 1,4-cyclohexanedimethylene group. $R^{104a}$ and $R^{104b}$ include a 2-oxopropyl group, a 2-oxocyclopentyl group, a 2-oxocyclohexyl group, and a 2-oxocycloheptyl group. K$^-$ includes the same as those described in the formula (P1a-1), (P1a-2) and (P1a-3).

[Formula 16]

(P2)

In the formula (P2), each of $R^{105}$ and $R^{106}$ independently represents a straight, branched or cyclic alkyl group or halogenated alkyl group having 1 to 12 carbon atoms, an aryl group or halogenated aryl group having 6 to 20 carbon atoms, or an aralkyl group having 7 to 12 carbon atoms.

The alkyl group in each of $R^{105}$ and $R^{106}$ includes a methyl group, an ethyl group, a propyl group, an isopropyl group, a n-butyl group, a sec-butyl group, a tert-butyl group, a pentyl group, a hexyl group, a heptyl group, an octyl group, an amyl group, a cyclopentyl group, a cyclohexyl group, a cycloheptyl group, a norbornyl group, and an adamantyl group. The halogenated alkyl group includes a trifluoromethyl group, a 1,1,1-trifluoroethyl group, a 1,1,1-trichloroethyl group, and a nonafluorobutyl group. The aryl group includes alkoxyphenyl groups such as a phenyl group, a p-methoxyphenyl group, a m-methoxyphenyl group, an o-methoxyphenyl group, an ethoxyphenyl group, a p-tert-butoxyphenyl group, and a m-tert-butoxyphenyl group, and alkylphenyl groups such as a 2-methylphenyl group, a 3-methylphenyl group, a 4-methylphenyl group, an ethylphenyl group, a 4-tert-butylphenyl group, a 4-butylphenyl group, and a dimethylphenyl group. The halogenated aryl group includes a fluorophenyl group, a chlorophenyl group, and a 1,2,3,4,5-pentafluorophenyl group. The aralkyl group includes a benzyl group and a phenethyl group.

[Formula 17]

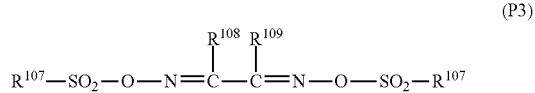

(P3)

In the formula (P3), each of $R^{107}$, $R^{108}$ and $R^{109}$ independently represents a straight, branched or cyclic alkyl group or halogenated alkyl group having 1 to 12 carbon atoms, an aryl group or halogenated aryl group having 6 to 20 carbon atoms, or an aralkyl group having 7 to 12 carbon atoms. $R^{108}$ and $R^{109}$ may be bonded with each other to form a cyclic structure, and if forming a cyclic structure, each of $R^{108}$ and $R^{109}$ represents a straight or branched alkylene group having 1 to 6 carbon atoms.

The alkyl group, halogenated alkyl group, aryl group, halogenated aryl group, and aralkyl group in each of $R^{107}$, $R^{108}$ and $R^{109}$ include the same as those described in $R^{105}$ and $R^{106}$. Herein, the alkylene group in each of $R^{108}$ and $R^{109}$ include a methylene group, an ethylene group, a propylene group, a butylene group, and a hexylene group.

[Formula 18]

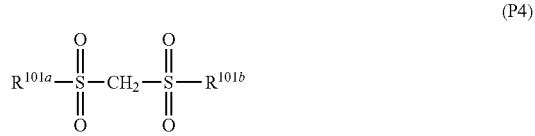

(P4)

In the formula (P4), $R^{101a}$ and $R^{101b}$ are the same as those described above.

[Formula 19]

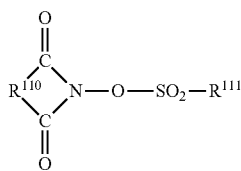

(P5)

In the formula (P5), $R^{110}$ represents an arylene group having 6 to 10 carbon atoms, an alkylene group having 1 to 6 carbon atoms, or an alkenylene group having 2 to 6 carbon atoms, and a part or all of hydrogen atoms of these groups may be further substituted with a straight or branched alkyl group or alkoxy group having 1 to 4 carbon atoms, a nitro group, an acetyl group, or a phenyl group. $R^{111}$ represents a straight, branched or substituted alkyl group, alkenyl group or alkoxyalkyl group having 1 to 8 carbon atoms, a phenyl group, or a naphthyl group, and a part or all of hydrogen atoms of these groups may be further substituted with an alkyl group or alkoxy group having 1 to 4 carbon atoms; a phenyl group that may be substituted with an alkyl group or alkoxy group having 1 to 4 carbon atoms, a nitro group, or an acetyl group; a heteroaromatic group having 3 to 5 carbon atoms; or a chlorine atom or a fluorine atom.

Herein, the arylene group in $R^{110}$ includes a 1,2-phenylene group and a 1,8-naphthylene group. The alkylene group includes a methylene group, an ethylene group, a trimethylene group, a tetramethylene group, a phenylethylene group, and a norbornane-2,3-diyl group. The alkenylene group includes a 1,2-vinylene group, a 1-phenyl-1,2-vinylene group, and a 5-norbornene-2,3-diyl group. The alkyl group in $R^{111}$ includes the same as those in $R^{101a}$ to $R^{101c}$. The alkenyl group includes a vinyl group, a 1-propenyl group, an allyl group, a 1-butenyl group, a 3-butenyl group, an isoprenyl group, a 1-pentenyl group, a 3-pentenyl group, a 4-pentenyl group, a dimethylallyl group, a 1-hexenyl group, a 3-hexenyl group, a 5-hexenyl group, a 1-heptenyl group, a 3-heptenyl group, a 6-heptenyl group, and a 7-octenyl group. The alkoxyalkyl group includes a methoxymethyl group, an ethoxymethyl group, a propoxymethyl group, a butoxymethyl group, a pentyloxymethyl group, a hexyloxymethyl group, a heptyloxymethyl group, a methoxyethyl group, an ethoxyethyl group, a propoxyethyl group, a butoxyethyl group, a pentyloxyethyl group, a hexyloxyethyl group, a methoxypropyl group, an ethoxypropyl group, a propoxypropyl group, a butoxypropyl group, a methoxybutyl group, an ethoxybutyl group, a propoxybutyl group, a methoxypentyl group, an ethoxypentyl group, a methoxyhexyl group, and a methoxyheptyl group.

Herein, the alkyl group having 1 to 4 carbon atoms, which may be further substituted, includes a methyl group, an ethyl group, a propyl group, an isopropyl group, a n-butyl group, a an isobutyl group, and a tert-butyl group. The alkoxy group having 1 to 4 carbon atoms includes a methoxy group, an ethoxy group, a propoxy group, an isopropoxy group, a n-butoxy group, an isobutoxy group, and tert-butoxy group. The phenyl group that may be substituted with an alkyl group or alkoxy group having 1 to 4 carbon atoms, a nitro group, or an acetyl group includes a phenyl group, a tolyl group, a p-tert-butoxyphenyl group, a p-acetylphenyl group, and a p-nitrophenyl group. The heteroaromatic group having 3 to 5 carbon atoms includes a pyridyl group and a furyl group.

Specific examples include onium salts such as tetramethylammonium trifluoromethanesulfonate, tetramethylammonium nonafluorobutanesulfonate, triethylammonium nonafluorobutanesulfonate, pyridinium nonafluorobutanesulfonate, triethylammonium camphorsulfonate, pyridinium camphorsulfonate, tetra n-butylammonium nonafluorobutanesulfonate, tetraphenylammonium nonafluorobutanesulfonate, tetramethylammonium p-toluenesulfonate, diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris (p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, trinaphthylsulfonium trifluoromethanesulfonate, cyclohexylmethyl(2-oxocyclohexyl)sulfonium trifluoromethanesulfonate, (2-norbornyl)methyl(2-oxocyclohexyl)sulfonium trifluoromethanesulfonate, ethylene bis [methyl(2-oxocyclopentyl)sulfonium trifluoromethanesulfonate], and 1,2'-naphthylcarbonylmethyltetrahydrothiophenium triflate, diazomethane derivatives such as bis(benzenesulfonyl)diazomethane, bis(p-toluenesulfonyl)diazomethane, bis(xylenesulfonyl)diazomethane, bis(cyclohexylsulfonyl)diazomethane, bis(cyclopentylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, bis(tert-butylsulfonyl)diazomethane, bis(n-amylsulfonyl)diazomethane, bis(isoamylsulfonyl) diazomethane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane, and 1-tert-amylsulfonyl-1-(tert-butylsulfonyl)diazomethane, glyoxime derivatives such as bis-(p-toluenesulfonyl)-α-dimethylglyoxime, bis-(p-toluesulfonyl)-α-diphenylglyoxime, bis-(p-toluenesulfonyl)-α-dicyclohexylglyoxime, bis-(p-toluenesulfonyl)-2,3-pentanedioneglyoxime, bis-(p-toluenesulfonyl)-2-methyl-3,4-pentanedioneglyoxime, bis-(n-butanesulfonyl)-α-dimethylglyoxime, bis-(n-butanesulfonyl)-α-diphenylglyoxime, bis-(n-butanesulfonyl)-α-dicyclohexylglyoxime, bis-(n-butanesulfonyl)-2,3-pentanedioneglyoxime, bis-(n-butanesulfonyl)-2-methyl-3,4-pentanedioneglyoxime, bis-(methanesulfonyl)-α-dimethylglyoxime, bis-(trifluoromethanesulfonyl)-α-dimethylglyoxime, bis-(1,1,1-trifluoroethanesulfonyl)-α-dimethylglyoxime, bis-(tert-butanesulfonyl)-α-dimethylglyoxime, bis-(perfluorooctanesulfonyl)-α-dimethylglyoxime, bis-(cyclohexanesulfonyl)-α-dimethylglyoxime, bis-(benzenesulfonyl)-α-dimethylglyoxime, bis-(p-fluorobenzenesulfonyl)-α- dimethylglyoxime, bis-(p-tert-butylbenzenesulfonyl)-α-dimethylglyoxime, bis-(xylenesulfonyl)-α-dimethylglyoxime, and bis-(camphorsulfonyl)-α-dimethylglyoxime, bissulfone derivatives, such as bisnaphthylsulfonylmethane, bistrifluoromethylsulfonylmethane, bismethylsulfonylmethane, bisethylsulfonylmethane, bispropylsulfonylmethane, bisisopropylsulfonylmethane, bis-p-toluenesulfonylmethane, and bisbenzenesulfonylmethane, β-ketosulfone derivatives such as 2-cyclohexylcarbonyl-2-(p-toluenesulfonyl)propane and 2-isopropylcarbonyl-2-(p-toluenesulfonyl)propane, disulfone derivatives such as a diphenyldisulfone derivative and a dicyclohexyldisulfone derivative, nitrobenzylsulfonate derivatives such as 2,6-dinitrobenzyl p-toluenesulfonate and 2,4-dinitrobenzyl p-toluenesulfonate, sulfonic acid ester derivatives such as 1,2,3-tris(methanesulfonyloxy)benzene, 1,2,3-tris(trifluoromethanesulfonyloxy)benzene, and 1,2,3-tris(p-toluenesulfonyloxy)benzene, and sulfonic acid ester derivatives of a N-hydroxyimide compound, such as N-hydroxysuccinimide methanesulfonic acid ester, N-hydroxysuccinimide trifluoromethanesulfonic acid ester, N-hydroxysuccinimide ethanesulfonic acid ester, N-hydroxysuccinimide 1-propanesulfonic acid ester, N-hydroxysuccinimide 2-propanesulfonic acid ester, N-hydroxysuccinimide 1-pentanesulfonic acid ester, N-hydroxysuccinimide 1-octanesulfonic acid ester, N-hydroxysuccinimide p-toluenesulfonic acid ester, N-hydroxysuccinimide p-methoxybenzenesulfonic acid ester, N-hydroxysuccinimide 2-chloroethanesulfonic acid ester, N-hydroxysuccinimide benzenesulfonic acid ester, N-hydroxysuccinimide-2,4,6-trimethylbenzenesulfonic acid ester, N-hydroxysuccinimide 1-naphthalenesulfonic acid ester, N-hydroxysuccinimide 2-naphthalenesulfonic acid ester, N-hydroxy-2-phenylsuccinimide methanesulfonic acid ester, N-hydroxymaleimide methanesulfonic acid ester, N-hydroxymaleimide ethanesulfonic acid ester, N-hydroxy-2-phenylmaleimide methanesulfonic acid ester, N-hydroxyglutarimide methanesulfonic acid ester, N-hydroxyglutarimide benzenesulfonic acid ester, N-hydroxyphthalimide methanesulfonic acid ester, N-hydroxyphthalimide benzenesulfonic acid ester, N-hydroxyphthalimide trifluoromethanesulfonic acid ester, N-hydroxyphthalimide p-toluenesulfonic acid ester, N-hydroxynaphthalimide methanesulfonic acid ester, N-hydroxynaphthalimide benzenesulfonic acid ester, N-hydroxy-5-norbornene-2,3-dicarboxylmide methanesulfonic acid ester, N-hydroxy-5-norbornene-2,3-dicarboxylmide trifluoromethanesulfonic acid ester, and N-hydroxy-5-norbornene-2,3-dicarboxylmide p-toluenesulfonic acid ester.

Among them, in particular, onium salts such as triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, tris(p-tert-butoxyphenyl)sulfonium p-toluenesulfonate, trinaphthylsulfonium trifluoromethanesulfonate, cyclohexylmethyl(2-oxocyclohexyl)sulfonium trifluoromethanesulfonate, (2-norbornyl)methyl(2-oxocyclohexyl)sulfonium trifluoromethanesulfonate, and 1,2'-naphthylcarbonylmethyltetrahydrothiophenium triflate, diazomethane derivatives such as bis(benzenesulfonyl)diazomethane, bis(p-toluenesulfonyl)diazomethane, bis(cyclohexylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, and bis(tert-butylsulfonyl)diazomethane, glyoxime derivatives such as bis-(p-toluenesulfonyl)-α-dimethylglyoxime and bis-(n-butanesulfonyl)-α-dimethylglyoxime, bissulfone derivatives such as bisnaphthylsulfonylmethane, and sulfonic acid ester derivatives of an N-hydroxyimide compound, such as N-hydroxysuccinimide methanesulfonic acid ester, N-hydroxysuccinimide trifluoromethanesulfonic acid ester, N-hydroxysuccinimide 1-propanesulfonic acid ester, N-hydroxysuccinimide 2-propanesulfonic acid ester, N-hydroxysuccinimide 1-pentanesulfonic acid ester, N-hydroxysuccinimide p-toluenesulfonic acid ester, N-hydroxynaphthalimide methanesulfonic acid ester, and N-hydroxynaphthalimide benzenesulfonic acid ester are preferably used.

In the material for forming an underlayer film for lithography of the present embodiment, the content of the acid generator is not particularly limited, but it is preferably 0.1 to 50 parts by mass and more preferably 0.5 to 40 parts by mass based on 100 parts by mass of the phenolic resin. The content is set within the above range to result in a tendency to increase the acid generation amount to promote a crosslinking reaction, and also to result in a tendency to suppress the occurrence of the mixing phenomenon with a resist layer.

Furthermore, the material for forming an underlayer film for lithography of the present embodiment may contain a basic compound from the viewpoint of improving preservation stability.

The basic compound serves as a quencher to an acid for preventing a trace amount of the acid generated from the acid generator from promoting a crosslinking reaction. Examples of such a basic compound include primary, secondary, and tertiary aliphatic amines, mixed amines, aromatic amines, heterocyclic amines, a nitrogen-containing compound having a carboxy group, a nitrogen-containing compound having a sulfonyl group, a nitrogen-containing compound having a hydroxyl group, a nitrogen-containing compound having a hydroxyphenyl group, an alcoholic nitrogen-containing compound, an amide derivative, and an imide derivative, but are not particularly limited thereto.

Specific examples of the primary aliphatic amines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Specific examples of the secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Specific examples of the tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Specific examples of the mixed amines include dimethylethylamine, methylethylpropylamine, benzylamine, phenethylamine, and benzyldimethylamine. Specific examples of the aromatic amines and heterocyclic amines include aniline derivatives (for example, aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (for example, pyrrole, 2H-pyrrole, 1-methylpyrrole, 2,4-dimethylpyrrole, 2,5-dimethylpyrrole, and N-methylpyrrole), oxazole derivatives (for example, oxazole and isoxazole), thiazole derivatives (for example, thiazole and isothiazole), imidazole derivatives (for example, imidazole, 4-methylimidazole, and 4-methyl-2-phenylimidazole), pyrazole derivatives, furazan derivatives, pyrroline derivatives (for example, pyrroline and 2-methyl-1-pyrroline), pyrrolidine derivatives (for example, pyrrolidine, N-methylpyrrolidine, pyrrolidinone, and N-methylpyrrolidone), imidazoline derivatives, imidazolidine derivatives, pyridine derivatives (for example, pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (for example, quinoline, 3-quinolinecarbonitrile), isoquinoline derivatives, cinnoline derivatives, quinazoline derivatives, quinoxaline derivatives, phthalazine derivatives, purine derivatives, pteridin derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Furthermore, specific examples of the nitrogen-containing compound having a carboxy group include aminobenzoic acid, indolecarboxylic acid, and amino acid derivatives (for example, nicotinic acid, alanine, arginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Specific examples of the nitrogen-containing compound having a sulfonyl group include 3-pyridinesulfonic acid and pyridinium p-toluenesulfonate. Specific examples of the nitrogen-containing compound having a hydroxyl group, the nitrogen-containing compound having a hydroxyphenyl group, and the alcoholic nitrogen-containing compound include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of the amide derivative include formamide, N-methylformamide, N,N-dimethylformamide, acetamide, N-methylacetamide, N,N-dimethylacetamide, propionamide, and benzamide. Examples of the imide derivative include phthalimide, succinimide, and maleimide.

In the material for forming an underlayer film for lithography of the present embodiment, the content of the basic compound is not particularly limited, but it is preferably 0.001 to 2 parts by mass and more preferably 0.01 to 1 part based on 100 parts by mass of the phenolic resin. The content is set within the above preferable range to result in a tendency to improve preservation stability without excessively interrupting a crosslinking reaction.

In addition, the material for forming an underlayer film for lithography of the present embodiment may contain other resins and/or compounds for the purpose of imparting heat curability and controlling absorbance. Such other resins and/or compounds include naphthol resins, xylene resins naphthol-modified resins, phenol-modified resins of naphthalene resins, polyhydroxystyrene, dicyclopentadiene resins, (meth)acrylate, dimethacrylate, trimethacrylate, tetramethacrylate, resins having a naphthalene ring such as vinylnaphthalene and polyacenaphthylene, resins having a biphenyl ring such as phenanthrenequinone and fluorene, resins having a heterocyclic ring having a hetero atom such as thiophene and indene, and resins not containing an aromatic ring; rosin-based resins, and resins or compounds including an alicyclic structure, such as cyclodextrin, adamantane(poly)ol, tricyclodecane(poly)ol and derivatives thereof, but are not particularly limited thereto. Furthermore, the material for forming an underlayer film for lithography of the present embodiment may contain additives known in the art, such as an ultraviolet absorber, a surfactant, a colorant, and a non-ionic surfactant.

[Underlayer Film for Lithography and Forming Method of Multilayer Resist Pattern]

An underlayer film for lithography of the present embodiment is formed from the material for forming an underlayer film for lithography.

In addition, a forming method of a multilayer resist pattern of the present embodiment includes forming an underlayer film on a substrate by using the material for forming an underlayer film for lithography, forming at least one photoresist layer on the underlayer film, then irradiating a required region of the photoresist layer with radiation, and developing it with an alkali.

Furthermore, a forming method of a multilayer resist pattern of the present embodiment includes forming an underlayer film on a substrate by using the material for forming an underlayer film for lithography, forming an intermediate layer film on the underlayer film by using a silicon atom-containing resist intermediate layer film material, forming at least one photoresist layer on the intermediate layer film, then irradiating a required region of the photoresist layer with radiation, developing it with an alkali to form a resist pattern, and then etching the intermediate layer film with the resist pattern as a mask, etching the underlayer film with the obtained intermediate layer film pattern as an etching mask and etching the substrate with the obtained underlayer film pattern as an etching mask, to form a pattern on the substrate.

The underlayer film for lithography of the present embodiment is not particularly limited in terms of the forming method thereof as long as it is formed from the material for forming an underlayer film for lithography, and a method known in the art can be applied. For example, the underlayer film can be formed by applying the material for forming an underlayer film for lithography on the substrate by a known coating method or printing method such as spin coating or screen printing, and removing an organic solvent by volatilization or the like. The underlayer film is desirably baked upon forming in order to suppress the occurrence of the mixing phenomenon with an upperlayer resist and also promote a crosslinking reaction. In this case, the baking temperature is not particularly limited, but it is preferably within the range of 80 to 450° C., and more preferably 200 to 400° C. In addition, the baking time is not also particularly limited, but is preferably within the range of 10 to 300 seconds. Herein, the thickness of the underlayer film can be appropriately selected depending on the required properties, and is not particularly limited, but it is usually preferably about 30 to 20,000 nm, and more preferably 50 to 15,000 nm.

After the underlayer film is prepared on the substrate, in the case of a two-layer process, a silicon-containing resist layer or a usual single-layer resist including a hydrocarbon can be prepared on the underlayer film, and in the case of a three-layer process, a silicon-containing intermediate layer can be prepared on the underlayer film, and a single-layer resist layer not containing silicon can be prepared on the silicon-containing intermediate layer. In these cases, a photoresist material for forming the resist layer, which can be used, is appropriately selected from known ones, and is not particularly limited.

As the silicon-containing resist material for a two-layer process, a positive-type photoresist material is preferably used, which contains a silicon atom-containing polymer such as a polysilsesquioxane derivative or a vinylsilane derivative used as a base polymer in terms of oxygen gas-etching resistance, and an organic solvent, an acid generator and if necessary a basic compound, but is not particularly limited. Herein, as the silicon atom-containing polymer, a known polymer used in such a resist material can be used.

As the silicon-containing intermediate layer for a three-layer process, a polysilsesquioxane-based intermediate layer is preferably used. The intermediate layer is allowed to have an effect as an antireflective film, thereby making it possible to suppress reflection. For example, if a material including many aromatic groups and having a high substrate-etching resistance is used for the underlayer film in a 193 nm light exposure process, a k-value tends to be increased to increase substrate reflection, but the reflection can be suppressed by the intermediate layer to thereby make the substrate reflection 0.5% or less. For the intermediate layer having such an antireflection effect, polysilsesquioxane into which a phenyl group or a light-absorbing group having a silicon-silicon bond for 193 nm light exposure is introduced and which is to be crosslinked with an acid or heat is preferably used, but is not particularly limited.

An intermediate layer formed by the Chemical Vapour Deposition (CVD) method can also be used. As the intermediate layer having a high effect as an antireflective film, prepared by the CVD method, for example, a SiON film is known. In general, the intermediate layer is formed by a wet process such as a spin coating method or screen printing rather than the CVD method in terms of simplicity and cost effectiveness. Herein, the upperlayer resist in a three-layer process may be of positive-type or negative-type, and the same one as a commonly used single-layer resist can be used therefor.

Furthermore, the underlayer film of the present embodiment can also be used as a usual antireflective film for use in a single-layer resist or a usual underlying material for suppressing pattern collapse. The underlayer film of the present embodiment can also be expected to serve as a hard mask for underlying processing because of being excellent in etching resistance for underlying processing.

In the case where a resist layer is formed by the photoresist material, a wet process such as a spin coating method or screen printing is preferably used as in the case of forming the underlayer film. The resist material is coated by a spin coating method or the like and then usually pre-baked, and such pre-baking is preferably performed in the range of 80 to 180° C. for 10 to 300 seconds. Thereafter, in accordance with an ordinary method, the resultant can be subjected to light exposure, post-exposure bake (PEB), and development to obtain a resist pattern. Herein, the thickness of the resist layer is not particularly limited, but it is 30 to 500 nm and particularly preferably 50 to 400 nm.

Light for use in light exposure may be appropriately selected depending on the photoresist material to be used. In general, examples thereof include high energy radiation having a wavelength of 300 nm or less, specifically, excimer lasers of 248 nm, 193 nm, and 157 nm, a soft X-ray of 3 to 20 nm, electron beam, and an X-ray.

The resist pattern formed by the above method is a pattern whose collapse is suppressed by the underlayer film of the present embodiment. Therefore, the underlayer film of the present embodiment can be used to thereby obtain a finer pattern, and a light exposure amount necessary for obtaining such a resist pattern can be reduced.

Then, the obtained resist pattern is used as a mask to perform etching. As the etching of the underlayer film in a two-layer process, gas etching is preferably used. As the gas etching, etching using oxygen gas is suitable. In addition to oxygen gas, an inert gas such as He and Ar, and CO, $CO_2$, $NH_3$, $SO_2$, $N_2$, $NO_2$, and $H_2$ gases can also be added. The gas etching can also be performed not using oxygen gas but using only CO, $CO_2$, $NH_3$, $N_2$, $NO_2$, and $H_2$ gases. In particular, the latter gases are used for protecting a side wall for preventing a pattern side wall from being undercut. On the other hand, also in the etching of the intermediate layer in a three-layer process, gas etching is preferably used. As the gas etching, the same one as the one described in a two-layer process can be applied. In particular, the intermediate layer is preferably processed in a three-layer process using a fluorocarbon gas with the resist pattern as a mask. Thereafter, as described above, the intermediate layer pattern is used as a mask to perform, for example, oxygen gas etching, thereby processing the underlayer film.

Herein, in the case where an inorganic hard mask intermediate layer film is formed as the intermediate layer, a silicon oxide film, a silicon nitride film, and a silicon oxynitride film (SiON film) are formed by the CVD method, the ALD method, and the like. The method for forming a nitride film is described in, for example, Japanese Patent Laid-Open No. 2002-334869 and WO2004/066377.

While the photoresist layer can be directly formed on such an intermediate layer film, an organic antireflective film (BARC) may also be formed on the intermediate layer film by spin coating, and the photoresist layer may also be formed thereon.

As the intermediate layer, a polysilsesquioxane-based intermediate layer is also preferably used. The resist intermediate layer film is allowed to have an effect as an antireflective film, thereby making it possible to suppress reflection. A material for the polysilsesquioxane-based intermediate layer is described in, for example, Japanese Patent Laid-Open No. 2007-226170 and Japanese Patent Laid-Open No. 2007-226204.

Then, the next etching of the substrate can also be performed by an ordinary method, and, for example, when the substrate is made of $SiO_2$ or SiN, etching with mainly a fluorocarbon gas can be performed, and when the substrate is made of p-Si, Al, or W, etching mainly using a chlorine-based gas or bromine-based gas can be performed. In the case where the substrate is processed by the etching with a fluorocarbon gas, the silicon-containing resist in a two-layer resist process and the silicon-containing intermediate layer in a three-layer process are peeled off at the same time as the processing of the substrate. On the other hand, in the case where the substrate is processed by the etching with a chlorine-based gas or bromine-based gas, the silicon-containing resist layer or the silicon-containing intermediate layer is peeled off separately, and is generally peeled off by dry etching with a fluorocarbon gas after the substrate is processed.

The underlayer film of the present embodiment is characterized by being excellent in etching resistance of such a substrate.

Herein, the substrate that can be used is appropriately selected from ones known in the art, and is not particularly limited, but includes Si, α-Si, p-Si, $SiO_2$, SiN, SiON, W, TiN, and Al substrates. The substrate may also be a laminate having a processed film on a base material (support). Such a processed film includes various Low-k films made of Si, $SiO_2$, SiON, SiN, p-Si, α-Si, W, W—Si, Al, Cu, and Al—Si, and stopper films thereof, and a material different from the base material (support) is usually used therefor. Herein, the thickness of the substrate to be processed or the processed film is not particularly limited, but it is usually preferably about 50 to 10,000 nm and more preferably 75 to 5,000 nm.

EXAMPLES

Hereinafter, the present invention will be described by Synthesis Examples and Examples in more detail, but the present invention is not limited thereto at all.

Carbon Concentration and Oxygen Concentration in Phenolic Resin

The carbon concentration and the oxygen concentration (% by mass) in the phenolic resin were measured by organic element analysis.

Apparatus: CHN CORDER MT-6 (manufactured by Yanaco Bunseki Kogyo Co.)

Molecular Weight

Gel permeation chromatography (GPC) analysis was used to determine the weight average molecular weight (Mw) and the number average molecular weight (Mn) in terms of polystyrene, and to determine the degree of dispersion (Mw/Mn).

Apparatus: Shodex GPC-101 type (manufactured by Showa Denko K. K.)

Column: LF-804×3
Eluent: THF 1 ml/min
Temperature: 40° C.

Pyrolysis Property

The thermal weight loss rate (amount of pyrolysis (%)) at the time of reaching 400° C. was measured.

Apparatus: TG/DTA6200 (manufactured by SII Nanotechnology Inc.)

Measuring temperature: 30 to 550° C. (rate of temperature rise: 10° C./min)

Measuring atmosphere: under $N_2$ or Air flow

Synthesis Example 1

To a four-neck flask having an inner volume of 1 L, equipped with a Dimroth condenser, a thermometer and a stirring blade, were charged 144 g (1.0 mol) of 1-naphthol (produced by Acros Organics) and 182 g (1.0 mol) of biphenylaldehyde (produced by Mitsubishi Gas Chemical Company, Inc.) under a nitrogen stream, and heated and melted at 120° C., thereafter, 0.5 ml of methanesulfonic acid (produced by Kanto Chemical Co., Inc.) was added thereto to start a reaction, and immediately thereafter, the temperature was raised to 220° C. to allow the reaction to run for 6 hours. At 2 hours and 4 hours after the start of the reaction, 0.5 ml of methanesulfonic acid was added thereto. The resultant was diluted with 400 g of methyl isobutyl ketone (produced by Kanto Chemical Co., Inc.) and 200 g of anisole (produced by Kanto Chemical Co., Inc.), and then neutralized and washed with water, and the solvent was removed under reduced pressure to thereby provide 255 g of a phenolic resin (NF-1) of Synthesis Example 1.

As a result of GPC analysis, Mn was 798, Mw was 1135, and Mw/Mn was 1.42. As a result of organic element analysis, the carbon concentration was 91.1% by mass and the oxygen concentration was 3.6% by mass. As a result of thermogravimetric measurement (TG), the thermal weight loss rates at 400° C. were 9% ($N_2$) and 15% (Air).

In addition, the solubility of the phenolic resin obtained in Synthesis Example 1 in propylene glycol monomethyl ether acetate was 10% by mass or more.

[Evaluation of Resin]

It was confirmed from the results of Synthesis Example 1 that the phenolic resin obtained by reacting the compound represented by the formula (1) and the aldehyde represented by the formula (3) in the presence of an acidic catalyst had a high carbon concentration and also had a solubility in propylene glycol monomethyl ether acetate of 10% by mass or more.

Synthesis Example 2

To a four-neck flask having an inner volume of 1 L, equipped with a Dimroth condenser, a thermometer and a stirring blade, were charged 144 g (1.0 mol) of 1-naphthol (produced by Acros Organics) and 182 g (1.0 mol) of biphenylaldehyde (produced by Mitsubishi Gas Chemical Company, Inc.) under a nitrogen stream, and heated and melted at 120° C., thereafter, 3.0 g of oxalic acid (produced by Kanto Chemical Co., Inc.) was added thereto to start a reaction, and immediately thereafter, the temperature was raised to 220° C. to allow the reaction to run for 6 hours. At 2 hours and 4 hours after the start of the reaction, 3.0 g of oxalic acid was added thereto. The resultant was diluted with 400 g of methyl isobutyl ketone (produced by Kanto Chemical Co., Inc.) and 200 g of anisole (produced by Kanto Chemical Co., Inc.), and then neutralized and washed with water, and the solvent was removed under reduced pressure to thereby provide 190 g of a phenolic resin (NF-2) of Synthesis Example 2.

As a result of GPC analysis, Mn was 600, Mw was 849, and Mw/Mn was 1.42. As a result of organic element analysis, the carbon concentration was 91.1% by mass and the oxygen concentration was 3.6% by mass. As a result of thermogravimetric measurement (TG), the thermal weight loss rates at 400° C. were 15% ($N_2$) and 16% (Air).

In addition, the solubility of the phenolic resin obtained in Synthesis Example 2 in propylene glycol monomethyl ether acetate was 10% by mass or more.

[Evaluation of Resin]

It was confirmed from the results of Synthesis Example 2 that the phenolic resin obtained by reacting the compound represented by the formula (1) and the aldehyde represented by the formula (3) in the presence of an acidic catalyst had a high carbon concentration and also had a solubility in propylene glycol monomethyl ether acetate of 10% by mass or more.

Synthesis Example 3

To a four-neck flask having an inner volume of 1 L, equipped with a Dimroth condenser, a thermometer and a stirring blade, were charged 144 g (1.0 mol) of 1-naphthol (produced by Acros Organics) and 156 g (1.0 mol) of 1-naphthaldehyde (produced by Kanto Chemical Co., Inc.) under a nitrogen stream, and heated and melted at 120° C., and thereafter, the temperature was raised to 220° C. (wherein the time of reaching 220° C. was defined as the start of the reaction) to allow the reaction to run for 6 hours. At 1 hour and 3 hours after the start of the reaction, 1.0 ml of methanesulfonic acid (produced by Kanto Chemical Co., Inc.) was added thereto. The resultant was diluted with 400 g of methyl isobutyl ketone (produced by Kanto Chemical Co., Inc.) and 200 g of anisole (produced by Kanto Chemical Co., Inc.), and then neutralized and washed with water, and the solvent and the unreacted raw materials were removed under reduced pressure to thereby provide 120 g of a phenolic resin (NF-3) of Synthesis Example 3.

As a result of GPC analysis, Mn was 680, Mw was 960, and Mw/Mn was 1.41. As a result of organic element analysis, the carbon concentration was 92.3% by mass and the oxygen concentration was 3.2% by mass. As a result of thermogravimetric measurement (TG), the thermal weight loss rates at 400° C. were 20% ($N_2$) and 14% (Air).

In addition, the solubility of the phenolic resin obtained in Synthesis Example 3 in propylene glycol monomethyl ether acetate was 10% by mass or more.

[Evaluation of Resin]

It was confirmed from the results of Synthesis Example 3 that the phenolic resin obtained by reacting the compound represented by the formula (1) and the aldehyde represented by the formula (3) in the presence of an acidic catalyst had a high carbon concentration and also had a solubility in propylene glycol monomethyl ether acetate of 10% by mass or more.

Production Example 1

Production of Dimethylnaphthalene Formaldehyde Resin

To a four-neck flask having a bottom outlet and an inner volume of 10 L, equipped with a Dimroth condenser, a thermometer and a stirring blade, were charged 1.09 kg (7 mol, produced by Mitsubishi Gas Chemical Company, Inc.) of 1,5-dimethylnaphthalene, 2.1 kg (28 mol as formaldehyde, produced by Mitsubishi Gas Chemical Company, Inc.) of a 40% by mass aqueous formalin solution and 0.97 of 98% by mass sulfuric acid (produced by Kanto Chemical Co., Inc.) under a nitrogen stream, and allowed the reaction to run under ordinary pressure for 7 hours with refluxing at 100° C. Ethylbenzene (special grade chemical, produced by Wako Pure Chemical Industries, Ltd.) (1.8 kg) as a dilution solvent was added thereto and left to stand, and then an aqueous phase being a bottom phase was removed. Furthermore, the resultant was neutralized and washed with water, and ethylbenzene and the unreacted 1,5-dimethylnaphthalene were distilled off under reduced pressure, thereby providing 1.25 kg of a dimethylnaphthalene formaldehyde resin as a light-brown solid.

As a result of GPC analysis, Mn was 562, Mw was 1168, and Mw/Mn was 2.08. As a result of organic element analysis, the carbon concentration was 84.2% by mass and the oxygen concentration was 8.3% by mass.

Herein, the solubility of the obtained dimethylnaphthalene formaldehyde resin in propylene glycol monomethyl ether acetate was less than 10% by mass.

Production Example 2

Production of Naphthol-Modified Dimethylnaphthalene Formaldehyde Resin

In a four-neck flask having an inner volume of 0.5 L, equipped with a Dimroth condenser, a thermometer and a stirring blade, 0.05 g of p-toluenesulfonic acid was added to 100 g (0.51 mol) of the dimethylnaphthalene formaldehyde resin obtained in Production Example 1 under a nitrogen stream, heated for 2 hours with the temperature being raised to 190° C., and stirred. Thereafter, 52.0 g (0.36 mol) of 1-naphthol was added thereto, and heated to 220° C. to allow the reaction to run for 2 hours. After being diluted with a solvent, the resultant was neutralized and washed with water, and the solvent was removed under reduced pressure to thereby provide 126.1 g of a modified resin (CR-1) as a blackish brown solid.

As a result of GPC analysis, Mn was 885, Mw was 2220, and Mw/Mn was 4.17. As a result of organic element analysis, the carbon concentration was 89.1% by mass and the oxygen concentration was 4.5% by mass. As a result of thermogravimetric measurement (TG), the thermal weight loss rates at 400° C. were 35% ($N_2$) and 32% (Air).

Herein, the solubility of the obtained naphthol-modified dimethylnaphthalene formaldehyde resin in propylene glycol monomethyl ether acetate was 10% by mass or more.

Examples 1 to 3

Comparative Example 1

Each material for forming an underlayer film, having each composition shown in Table 1, was prepared. Then, such a material for forming an underlayer film was spin-coated on a silicon substrate, baked at 240° C. for 60 seconds and further at 400° C. for 120 seconds to prepare each underlayer film having a film thickness of 200 nm.

An etching test was performed under conditions shown below to evaluate etching resistance. The evaluation results are shown in Table 1.

[Etching Test]

Etching apparatus: RIE-10NR manufactured by Samco Inc.
Output: 50 W
Pressure: 20 Pa
Time: 2 min
Etching Gas
Ar gas flow rate:$CF_4$ gas flow rate:$O_2$ gas flow rate=50:5:5 (sccm)

[Evaluation of Etching Resistance]

The evaluation of etching resistance was performed according to the following procedure.

First, an underlayer film of novolac was prepared under the same conditions as those in Example 1 except that novolac (PSM4357 produced by Gunei Chemical Industry Co., Ltd.) was used instead of the phenolic resin of Example 1. Then, the underlayer film of novolac was subjected to the etching test, and the etching rate in that time was measured.

Then, the underlayer films of Examples 1 to 3 and Comparative Example 1 were subjected to the etching test in the same manner, and the etching rates were measured.

Then, the etching resistances were evaluated according to the following criteria based on the etching rate of the underlayer film of novolac.

<Evaluation Criteria>
A; etching rate of −5% or less compared with novolac
B; etching rate of more than +5% compared with novolac

TABLE 1

|  | Resin (parts by mass) | Organic solvent (parts by mass) | Acid generator (parts by mass) | Crosslinking agent (parts by mass) | Evaluation of etching resistance |
|---|---|---|---|---|---|
| Example 1 | NF-1 (10) | CHN (89) | DTDPI (0.5) | Nikalac (0.5) | A |
| Example 2 | NF-2 (10) | CHN (89) | DTDPI (0.5) | Nikalac (0.5) | A |
| Example 3 | NF-3 (10) | CHN (89) | DTDPI (0.5) | Nikalac (0.5) | A |
| Comparative Example 1 | CR-1 (10) | CHN (89) | DTDPI (0.5) | Nikalac (0.5) | B |

Acid generator: di-tert-butyldiphenyliodonium nonafluoromethanesulfonate (DTDPI) produced by Midori Kagaku Co., Ltd.
Crosslinking agent: Nikalac MX270 (Nikalac) produced by Sanwa Chemical Co., Ltd.
Organic solvent: propylene glycol monomethyl ether acetate (PGMEA),
Organic solvent: cyclohexanone (CHN)
Novolac: PSM4357 produced by Gunei Chemical Industry Co., Ltd.

Example 4

Then, the material for forming an underlayer film of Example 1 was coated on a $SiO_2$ substrate having a film thickness of 300 nm, and baked at 240° C. for 60 seconds and further at 400° C. for 120 seconds to thereby form an underlayer film having a film thickness of 80 nm. A resist solution for ArF was coated on the underlayer film, and baked at 130° C. for 60 seconds to thereby form a photoresist layer having a film thickness of 150 nm. Herein, as the resist solution for ArF, one prepared by blending 5 parts by mass of the compound of the following formula (9), 1 part by mass of triphenylsulfonium nonafluoromethanesulfonate, 2 parts by mass of tributylamine, and 92 parts by mass of PGMEA was used.

[Formula 20]

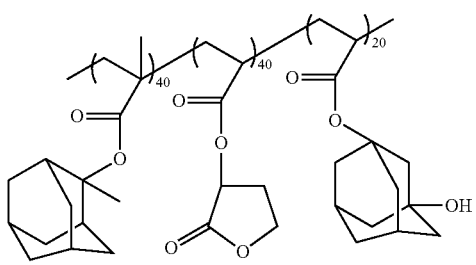

(9)

(in the formula (9), the numerals 40, 40, and 20 indicate the proportions of the respective constituent units, and do not mean a block copolymer.)

Then, the photoresist layer was exposed through a mask by using an electron beam lithography apparatus (ELS-7500, produced by Elionix, Inc., 50 keV), baked at 115° C. for 90 seconds (PEB), and developed with a 2.38% by mass aqueous tetramethylammonium hydroxide (TMAH) solution for 60 seconds, thereby providing a positive-type resist pattern of 55 mL/S (1:1). The shape of the obtained resist pattern was observed and the result thereof is shown in Table 2.

Example 5

Except that the material for forming an underlayer film of Example 2 was used, the same manner as in Example 4 was performed to form an underlayer film and a photoresist layer on a $SiO_2$ substrate to provide a positive-type resist pattern. The evaluation results are shown in Table 2.

Example 6

Except that the material for forming an underlayer film of Example 3 was used, the same manner as in Example 4 was performed to form an underlayer film and a photoresist layer on a $SiO_2$ substrate to provide a positive-type resist pattern. The evaluation results are shown in Table 2.

Comparative Example 2

Except that no underlayer film was formed, the same manner as in Example 4 was performed to form a photoresist layer on a $SiO_2$ substrate to provide a positive-type resist pattern. The evaluation results are shown in Table 2.

TABLE 2

|  | Material for forming underlayer film | Resolution (nmL/S) | Sensitivity ($\mu C/cm^2$) | Resist pattern formation after development |
|---|---|---|---|---|
| Example 4 | Material described in Table 1 (Example 1) was used | 55 | 12 | Good |
| Example 5 | Material described in Table 1 (Example 2) was used | 55 | 12 | Good |
| Example 6 | Material described in Table 1 (Example 3) was used | 55 | 12 | Good |
| Comparative Example 2 | Not used | 80 | 26 | Not good |

[Evaluation]
As can be seen from Table 2, it was confirmed that the underlayer films of Examples 4 to 6 were significantly excellent in resolution and sensitivity as compared with Comparative Example 2. In addition, it was confirmed that the shape of the resist pattern after development was also good. In addition, it was shown from the difference from the shape of the resist pattern after development that the phenolic resin of the present invention had good adhesiveness with a resist material.

Example 7

Then, the material for forming an underlayer film of Example 1 was coated on a $SiO_2$ substrate having a film thickness of 300 nm, and baked at 240° C. for 60 seconds and further at 400° C. for 120 seconds to thereby form an underlayer film having a film thickness of 80 nm. A silicon-containing intermediate layer material was coated on the underlayer film, and baked at 200° C. for 60 seconds to thereby form an intermediate layer film having a film thickness of 35 nm. Furthermore, the resist solution for ArF used in Example 4 was coated on the intermediate layer film, and baked at 130° C. for 60 seconds to thereby form a photoresist layer having a film thickness of 150 nm. Herein, as the silicon-containing intermediate layer material, a silicon atom-containing polymer described in <Synthesis Example 1> in Japanese Patent Laid-Open No. 2007-226170 was used.

Then, the photoresist layer was exposed through a mask by using an electron beam lithography apparatus (ELS-7500, produced by Elionix, Inc., 50 keV), baked at 115° C. for 90 seconds (PEB), and developed with a 2.38% by mass aqueous tetramethylammonium hydroxide (TMAH) solution for 60 seconds, thereby providing a positive-type resist pattern of 55 mL/S (1:1).

Then, the silicon-containing intermediate layer film (SOG) was subjected to dry etching processing with the obtained resist pattern as a mask using RIE-10NR manufactured by Samco Inc., and subsequently, dry etching processing of the underlayer film with the obtained silicon-containing intermediate layer film pattern as a mask and dry etching processing of the $SiO_2$ film with the obtained underlayer film pattern as a mask were performed, sequentially.

The respective etching conditions are shown as follows.

Conditions of resist pattern etching on resist intermediate layer film.
Output: 50 W
Pressure: 20 Pa
Time: 1 min
Etching gas
Ar gas flow rate:$CF_4$ gas flow rate:$O_2$ gas flow rate=50:8:2 (sccm)

Conditions of resist intermediate film pattern etching on resist underlayer film.
Output: 50 W
Pressure: 20 Pa
Time: 2 min
Etching gas
Ar gas flow rate:$CF_4$ gas flow rate:$O_2$ gas flow rate=50:5:5 (sccm)

Conditions of resist underlayer film pattern etching on $SiO_2$ film.
Output: 50 W
Pressure: 20 Pa
Time: 2 min
Etching gas
Ar gas flow rate:$C_5F_{12}$ gas flow rate:$C_2F_6$ gas flow rate:$O_2$ gas flow rate=50:4:3:1 (sccm)

[Evaluation]

The cross section of the pattern of Example 7 obtained as described above was observed using an electron microscope (S-4800) manufactured by Hitachi Ltd., and it was confirmed that in Example 7 using the underlayer film of the present invention, the shape of the $SiO_2$ film after etching in multilayer resist processing was good.

As described above, the present invention is not limited to the embodiments and Examples, and can be appropriately modified without departing the gist thereof.

INDUSTRIAL APPLICABILITY

Since the resin of the present invention has a relatively high carbon concentration and a relatively low oxygen concentration in the resin, has a relatively high heat resistance and also a relatively high solvent solubility, and can be applied to a wet process, it can be widely and effectively utilized in various applications in which these properties are required. Therefore, the present invention can be widely and effectively utilized for, for example, an electric insulating material; a resist resin; a sealing resin for a semiconductor; an adhesive for a printed wiring board; an electric laminated board mounted on electrical equipment, electronic equipment, industrial equipment and the like; a matrix resin for a prepreg mounted on electrical equipment, electronic equipment, industrial equipment and the like; a material for a build-up laminated board; a resin for fiber-reinforced plastics; a sealing resin for a liquid crystal display panel; a paint; various coating agents; an adhesive; a coating agent for a semiconductor; a resist resin for a semiconductor; and a resin for forming an underlayer film, and can be particularly effectively utilized in the field of an underlayer film for lithography and an underlayer film for a multilayer resist.

It is to be noted that the present application claims the priority based on Japanese Patent Application (Japanese Patent Application No. 2011-125029) filed to Japan Patent Office on Jun. 3, 2011, and the content thereof is herein incorporated as reference.

The invention claimed is:

1. A resin composition comprising
a resin obtained by reacting a compound represented by formula (1) and/or (2) with an aldehyde represented by formula (3) and/or (4) in the presence of an acidic catalyst

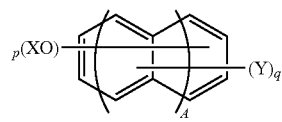

(1)

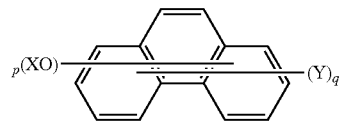

(2)

wherein in formulae (1) and (2), X represents a hydrogen atom, an alkyl group having 1 to 10 carbon atoms, an aryl group having 6 to 10 carbon atoms, or a cyclohexyl group, Y represents an alkyl group having 1 to 10 carbon atoms, an aryl group having 6 to 10 carbon atoms, or a cyclohexyl group, p represents a number of 1 to 3, q represents a number of 0 to 3, provided that when a plurality of Xs and Ys are present, Xs and Ys may be each the same or different, and A in formula (1) represents a number of 0 to 2, and

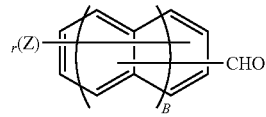

(3)

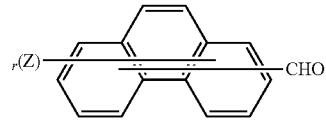

(4)

wherein in formulae (3) and (4), Z represents an alkyl group having 1 to 10 carbon atoms, an aryl group having 6 to 10 carbon atoms, a cyclohexyl group, a hydroxyl group, a formyl group, or a carbonyl group, r represents a number of 0 to 6, provided that when a plurality of Zs are present, Zs may be each the same or different, and B in formula (3) represents a number of 0 to 2, said resin comprising at least one structure represented by a formula selected from the group consisting of formulas (5), (6), (7) and (8):

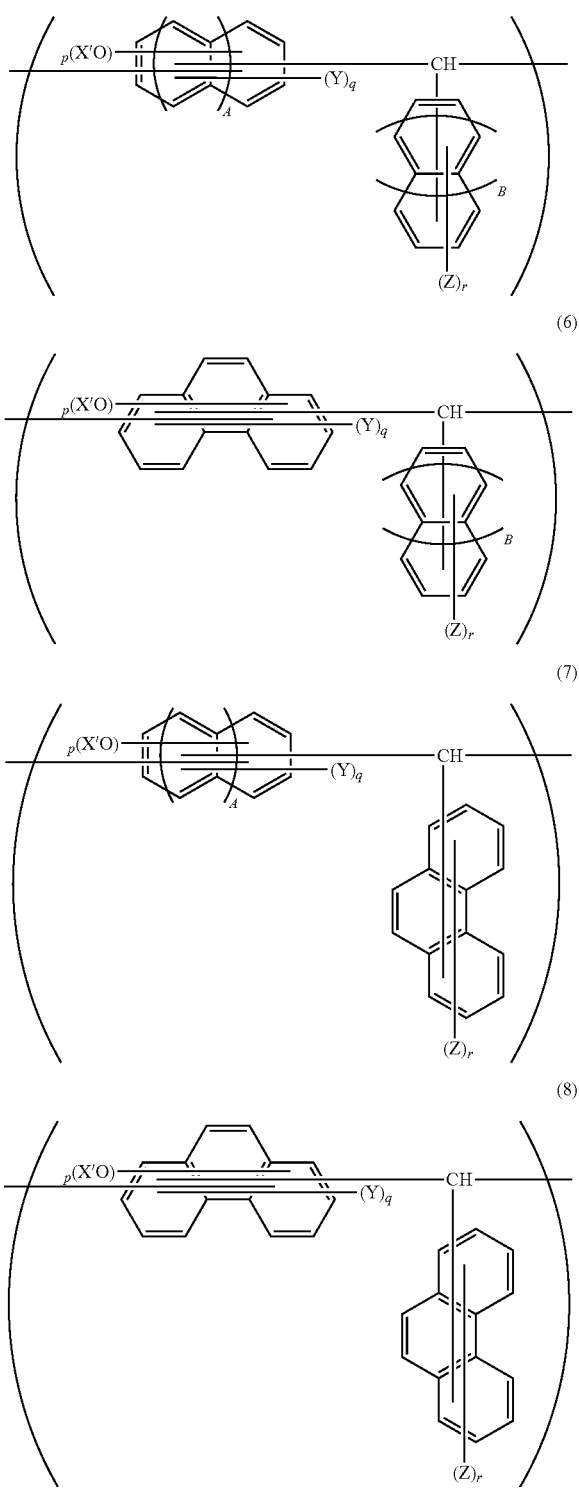

wherein all of Y, Z, p, q, r, A, and B are the same as described in the formulae (1), (2), (3) and (4), X' is the same as X in the formula (1) or (2), or a single bond for forming a direct bond with X, Y, Z, or an aromatic ring in the resin, wherein said resin has a carbon concentration of 90 to 99.9% by mass of the resin, an oxygen concentration of 0 to 5% by mass of the resin, and a solubility in propylene glycol monomethyl ether acetate of 10% or more by mass of the resin; and at least one of an acid generator and a crosslinking agent.

2. The resin composition according to claim 1, further comprising an organic solvent.

3. The resin composition according to claim 1, wherein said resin composition includes an acid generator.

4. The resin composition according to claim 1, wherein said resin composition includes a crosslinking agent.

5. A material for forming an underlayer film for lithography, comprising the resin composition according to claim 1.

6. An underlayer film for lithography, formed from the material for forming an underlayer film for lithography according to claim 5.

7. A pattern forming method comprising forming an underlayer film on a substrate by using the material for forming an underlayer film for lithography according to claim 5, forming at least one photoresist layer on the underlayer film, then irradiating a required region of the photoresist layer with radiation, and developing it with an alkali.

8. A pattern forming method comprising forming an underlayer film on a substrate by using the material for forming an underlayer film for lithography according to claim 5, forming an intermediate layer film on the underlayer film by using a silicon atom-containing resist intermediate layer film material, forming at least one photoresist layer on the intermediate layer film, then irradiating a required region of the photoresist layer with radiation, developing it with an alkali to form a resist pattern, and then etching the intermediate layer film with the resist pattern as a mask, etching the underlayer film with the obtained intermediate layer film pattern as an etching mask and etching the substrate with the obtained underlayer film pattern as an etching mask, to form a pattern on the substrate.

9. The resin composition according to claim 1, wherein the compound represented by the formula (1) is at least one selected from the group consisting of phenols, catechols, hydroquinones, cresols, ethylphenols, propylphenols, butylphenols, phenyiphenols, methylcatechols, methylhydroquinones, naphthols, dihydroxynaphthalenes, hydroxyanthracenes, dihydroxyanthracenes, trihydroxyanthracenes, and tetrahydroxyanthracenes.

10. The resin composition according to claim 1, wherein A in the formula (1) is 0 or 1.

11. The resin composition according to claim 1, wherein the compound represented by the formula (2) is at least one selected from the group consisting of phenanthrols, methyl phenanthrols, dimethyl phenanthrols, and dihydroxy phenanthrols.

12. The resin composition according to claim 1, wherein the aldehyde represented by the formula (3) is at least one selected from the group consisting of benzaldehydes, methylbenzaldehydes, ethylbenzaldehydes, propylbenzaldehydes, butylbenzaldehydes, cyclohexylbenzaldehydes, biphenylaldehydes, hydroxybenzaldehydes, dihydroxybenzaldehydes, naphthaldehydes, hydroxynaphthaldehydes, and anthracenecarboxyaldehydes.

13. The resin composition according to claim 1, wherein the aldehyde represented by the formula (4) is at least one selected from the group consisting of phenanthrenecarbaldehydes, methylphenanthrenecarbaldehydes, dimethylphenanthrenecarbaldehydes, hydroxyphenanthrenecarbaldehydes, and dihydroxyphenanthrenecarbaldehydes.

14. The resin composition according to claim 1, wherein the acidic catalyst is at least one selected from the group consisting of hydrochloric acid, sulfuric acid, phosphoric acid, oxalic acid, malonic acid, succinic acid, adipic acid, sebacic acid, citric acid, fumaric acid, maleic acid, formic acid, p-toluenesulfonic acid, methanesulfonic acid, trifluoroacetic acid, dichloroacetic acid, trichloroacetic acid, trifluoromethanesulfonic acid, benzenesulfonic acid, naphthalenesulfonic acid, naphthalenedisulfonic acid, zinc chloride, aluminum chloride, iron chloride, boron trifluoride, tungstosilicic acid, tungstophosphoric acid, silicomolybdic acid, phosphomolybdic acid, hydrobromic acid, and hydrofluoric acid.

* * * * *